United States Patent
Itonaga

(10) Patent No.: US 8,477,223 B2
(45) Date of Patent: Jul. 2, 2013

(54) SOLID-STATE IMAGING DEVICE, METHOD OF MANUFACTURING THE SAME, AND ELECTRONIC APPARATUS

(75) Inventor: Kazuichiro Itonaga, Tokyo (JP)

(73) Assignee: Sony Corporation, Tokyo (JP)

( * ) Notice: Subject to any disclaimer, the term of this patent is extended or adjusted under 35 U.S.C. 154(b) by 593 days.

(21) Appl. No.: 12/656,805

(22) Filed: Feb. 17, 2010

(65) Prior Publication Data

US 2010/0245637 A1 Sep. 30, 2010

(30) Foreign Application Priority Data

Mar. 31, 2009 (JP) .................................. 2009-088096

(51) Int. Cl.
*H04N 3/14* (2006.01)
*H04N 5/225* (2006.01)

(52) U.S. Cl.
USPC ............................ 348/273; 348/340; 348/294

(58) Field of Classification Search
USPC .................. 348/272, 273, 340, 294; 257/294, 257/432; 438/689, 713
See application file for complete search history.

(56) References Cited

U.S. PATENT DOCUMENTS

| | | | |
|---|---|---|---|
| 6,104,021 A * | 8/2000 | Ogawa ........................... | 257/432 |
| 6,188,094 B1 * | 2/2001 | Kochi et al. .................... | 257/432 |
| 6,803,250 B1 * | 10/2004 | Yaung et al. ..................... | 438/70 |
| 6,970,293 B2 * | 11/2005 | Natori ............................. | 257/294 |
| 7,488,615 B2 * | 2/2009 | Uya ................................ | 257/294 |
| 7,656,453 B2 * | 2/2010 | Nishi .............................. | 348/340 |
| 7,776,225 B2 * | 8/2010 | Tsukamoto ........... | 257/E27.156 |
| 2002/0102498 A1 * | 8/2002 | Hsin .............................. | 430/321 |
| 2004/0196563 A1 * | 10/2004 | Natori ............................. | 359/626 |
| 2006/0151818 A1 * | 7/2006 | Toumiya ........................ | 257/294 |
| 2007/0146513 A1 * | 6/2007 | Kuroiwa ........................ | 348/272 |
| 2009/0230490 A1 * | 9/2009 | Yokozawa ...................... | 438/70 |
| 2010/0084728 A1 * | 4/2010 | Yamada ......................... | 257/432 |

FOREIGN PATENT DOCUMENTS

JP 2007-88306 A 4/2007

* cited by examiner

*Primary Examiner* — Nhan T Tran
(74) *Attorney, Agent, or Firm* — Rader, Fishman & Grauer PLLC

(57) ABSTRACT

A solid-state imaging device includes: an on-chip color filter having color filter components formed to correspond to pixels; light-shielding members each formed at the boundary of adjacent color filter components; and lenses concave toward a light incident direction, each formed directly below a corresponding one of the color filter components by self-alignment with the light-shielding members as a mask.

15 Claims, 17 Drawing Sheets

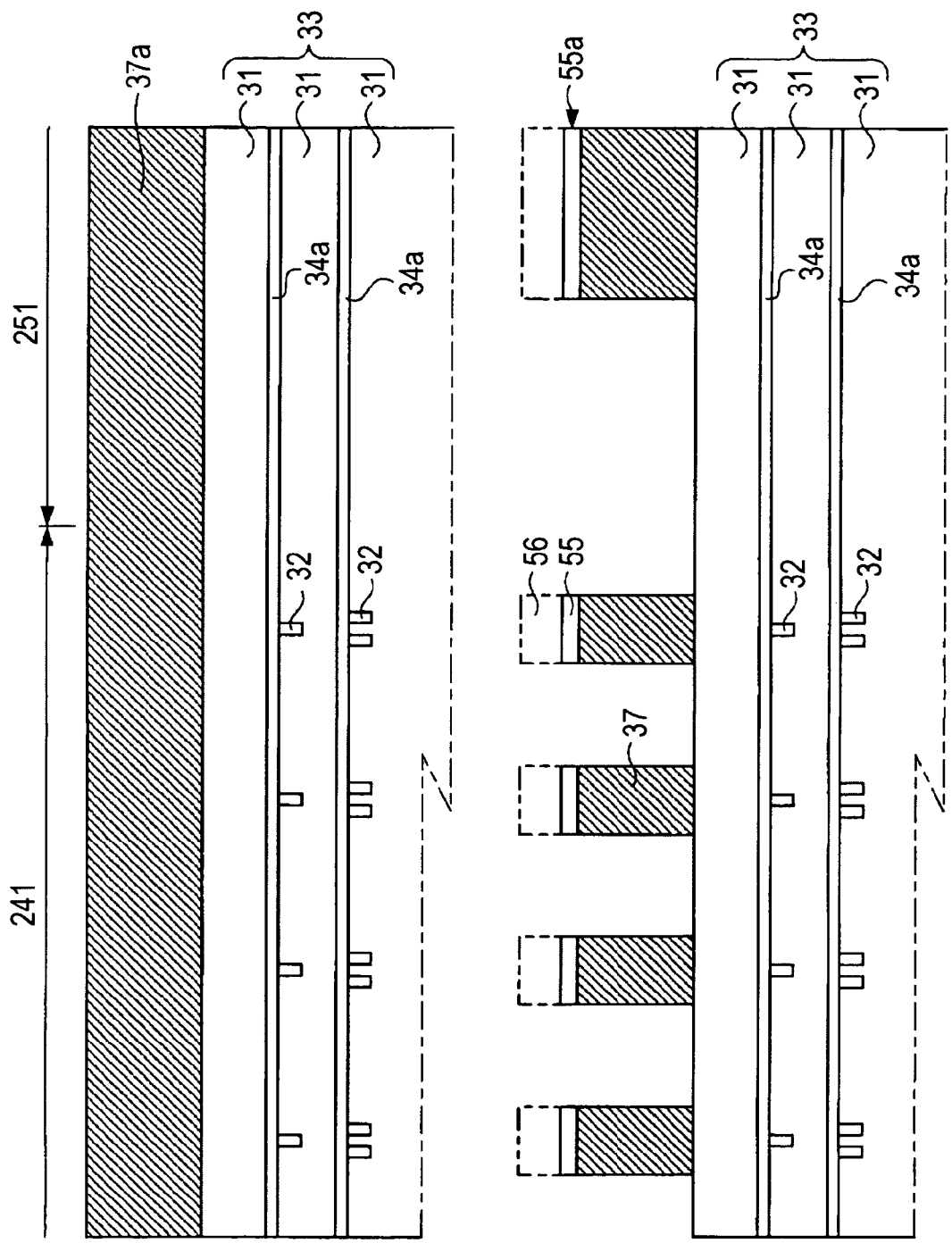

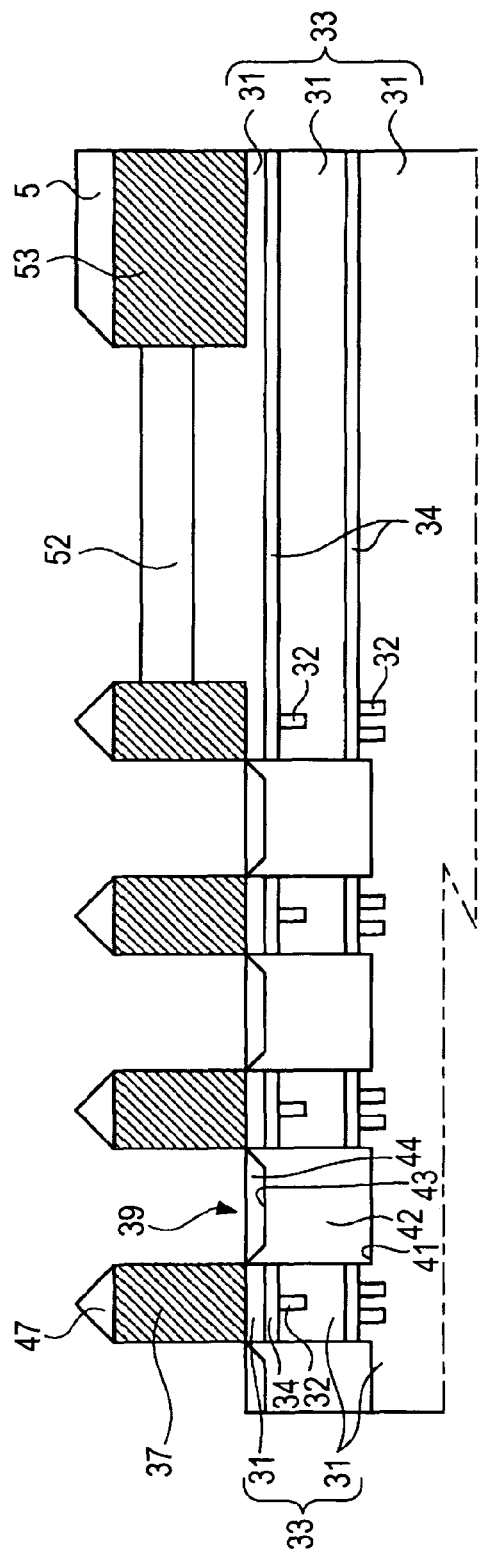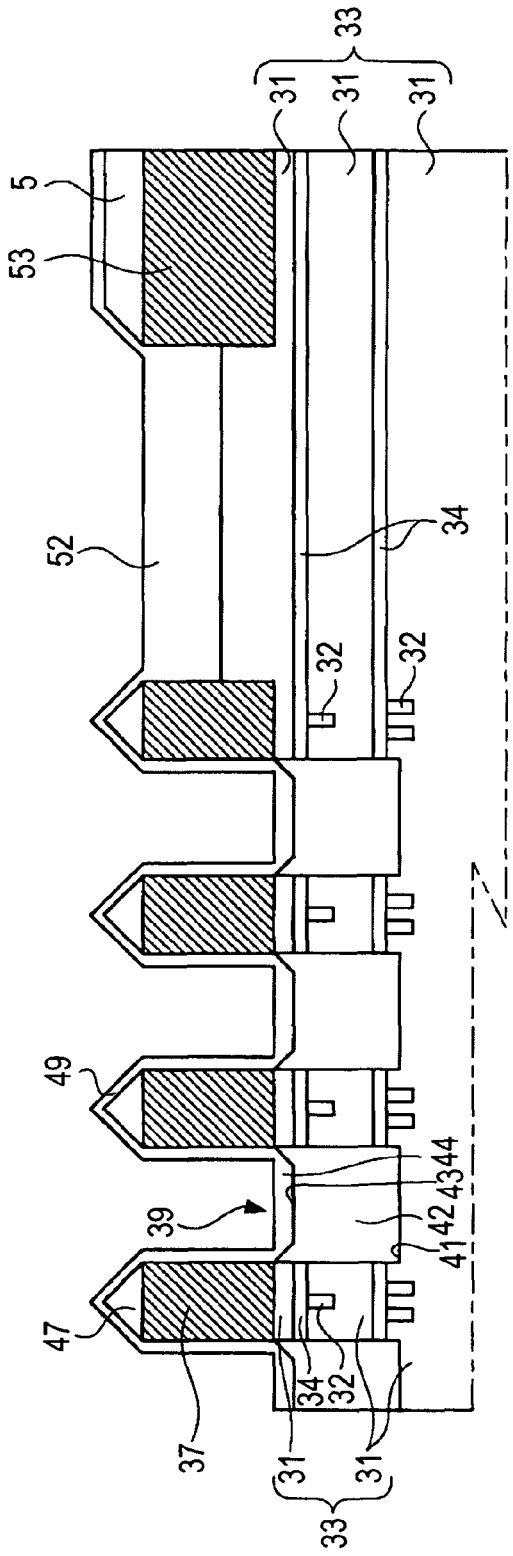
FIG.5A
FIG.5B

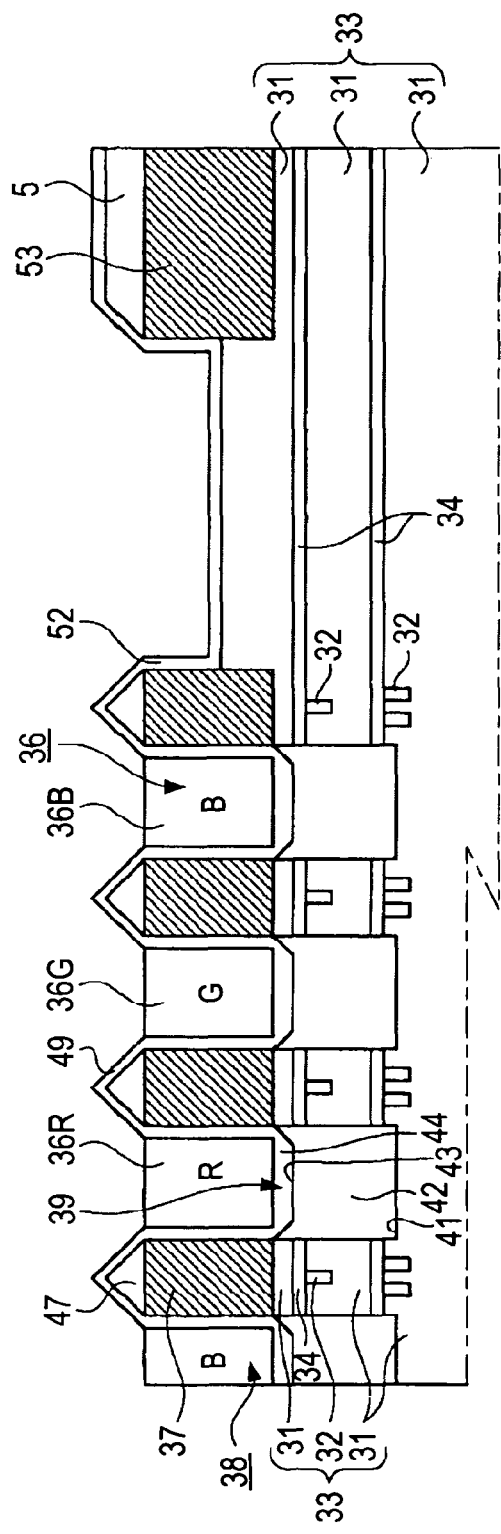
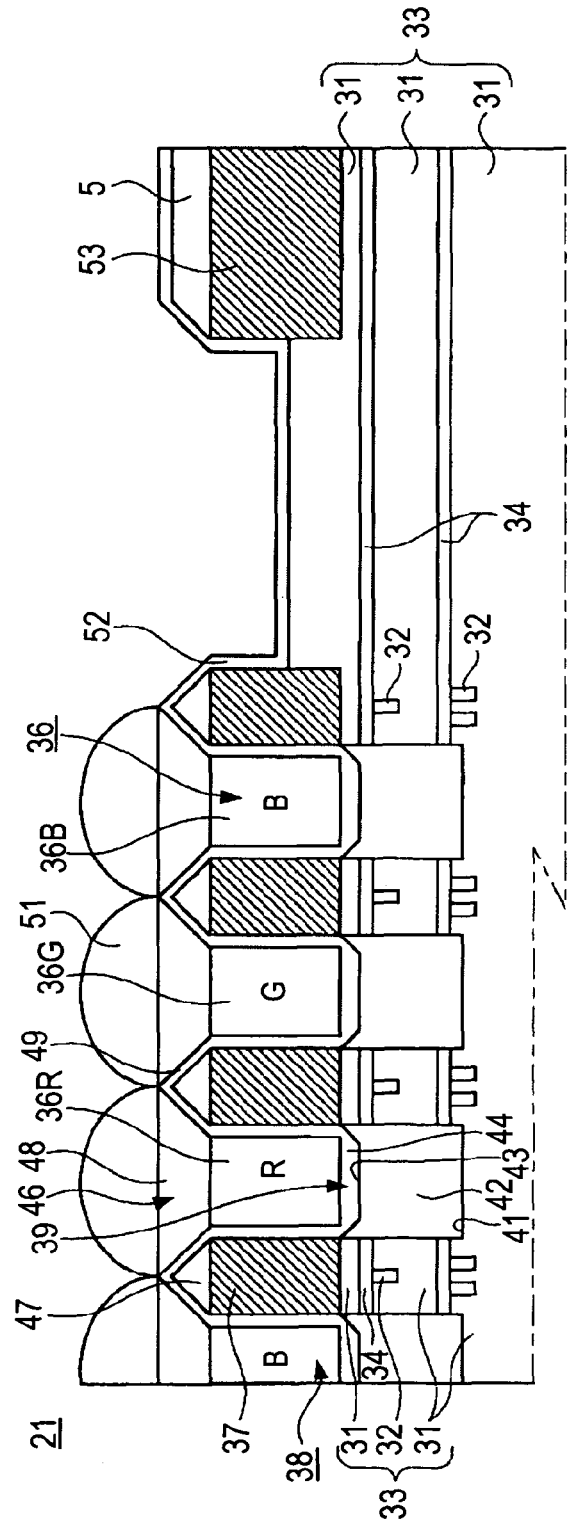
FIG.6A
FIG.6B

Background Art

SOLID-STATE IMAGING DEVICE, METHOD OF MANUFACTURING THE SAME, AND ELECTRONIC APPARATUS

BACKGROUND OF THE INVENTION

1. Field of the Invention

The present invention relates to a solid-state imaging device, a method of manufacturing the same, and an electronic apparatus, such as a camera with the solid-state imaging device.

2. Description of the Related Art

An amplification type solid-state imaging device is known which is exemplified by a MOS type image sensor, such as a CMOS (Complementary Metal Oxide Semiconductor) or the like as a solid-state imaging device. A charge transfer type solid-state imaging device is also known which is exemplified by a CCD (Charge Coupled Device) image sensor. The solid-state imaging devices are widely used for digital still cameras, digital video cameras, and the like. In recent years, as a solid-state imaging device mounted on a mobile apparatus, such as a camera-equipped mobile phone or a PDA (Personal Digital Assistant), a MOS type image sensor having a low power supply voltage is increasingly used from the viewpoint of power consumption.

A MOS solid-state imaging device includes unit pixels each having a photodiode serving as a photoelectric converter and a plurality of pixel transistors. The MOS solid-state imaging device has a pixel section (imaging area) where a plurality of unit pixels are arranged in a two-dimensional array, and a peripheral circuit area. In this solid-state imaging device, a multilayer wiring layer is provided which has multiple layers of wiring through interlayer insulating films. A plurality of pixel transistors are MOS transistors, and have three transistors of a transfer transistor, a reset transistor, and an amplification transistor, or four transistors also including a selection transistor. An on-chip color filter and overlying on-chip microlenses are formed on a light incidence side.

A CCD solid-state imaging device has a plurality of unit pixels arranged in a two-dimensional array, that is, a pixel section (imaging area) where photodiodes serving as photoelectric converters are provided and a vertical transfer register having a CCD structure is arranged to correspond to each photodiode column. The CCD type solid-state imaging device further has a horizontal transfer register having a CCD structure which transfers signal charges from the pixel section in a horizontal direction, an output section, and a peripheral circuit constituting a signal processing circuit. In this solid-state imaging device, an on-chip color filter and overlying on-chip microlenses are formed on a light incidence side.

In such a solid-state imaging device, with the reduction in size of pixels, it is necessary to improve sensitivity of pixels and to suppress color mixture. JP-A-2007-88306 discloses a MOS solid-state imaging device in which an in-layer lens is formed to be self-aligned with a base, thereby improving focusing characteristics.

SUMMARY OF THE INVENTION

In the above-described solid-state imaging device, if the pixels are further reduced in size, color mixture is likely to occur. Color mixture includes color mixture in the on-chip color filter, color mixture by a multilayer wiring layer, and color mixture in silicon. With the reduction in size of pixels, there is a significant influence due to overlapping of color filter components in the on-chip color filter, so color mixture is likely to occur and spectral characteristics are deteriorated.

As shown in FIG. 22, an on-chip color filter 201 is structured such that color filter components 201R, 201G, and 201B of red (R), green (G), and blue (B) inevitably have a tapered or reverse-tapered trapezoidal shape, and some adjacent color filter components overlap each other. On-chip microlenses 202 are formed on the on-chip color filter 201. The overlap area of adjacent color filter components deteriorates the spectral characteristics. As shown in FIG. 22, when the overlap portion is referred to as a color mixture area 203, if one pixel pitch P is reduced due to the reduction in size of pixels, the ratio of the color mixture area with respect to the pixel pitch P increases, and the spectral characteristics are further deteriorated.

FIG. 23 shows the relationship between the pixel pitch P and the ratio of the color mixture area 203. In FIG. 23, the vertical axis represents a sensitivity reduction area (%) corresponding to the color mixture area 203, and the horizontal axis represents the pixel pitch P ($\mu$m). An angle as a parameter is the taper angle $\theta$ of each of the color filter components shown in FIG. 22. If the pixel pitch P decreases as the taper angle $\theta$ increases, the ratio of the sensitivity reduction area increases, and color mixture increases. The sensitive reduction area is desirably suppressed to be equal or less than 10%.

It is desirable to provide a solid-state imaging device capable of suppressing color mixture even if pixels are reduced in size.

It is also desirable to provide an electronic apparatus, such as a camera including the solid-state imaging device.

An embodiment of the invention provides a solid-state imaging device. The solid-state imaging device includes an on-chip color filter having color filter components formed to correspond to pixels, light-shielding members each formed at the boundary of adjacent color filter components, and lenses concave toward a light incident direction, each formed directly below a corresponding one of the color filter components by self-alignment with the light-shielding members as a mask.

In this solid-state imaging device, since the light-shielding member is formed at the boundary of adjacent color filter components, light incident on the respective color filter components is reflected and absorbed by the light-shielding member, such that light is not incident on adjacent color filter components. Since the lenses concave toward a light incident direction are respectively formed directly below the color filter components, incident light is focused by the lens, and there is no case where part of light is incident on adjacent pixels. The lenses are formed by self-alignment with the light-shielding members as a mask, so there is no misalignment between the color filter components and the lenses.

Another embodiment of the invention provides a solid-state imaging device. The solid-state imaging device includes an on-chip color filter having color filter components formed to correspond to pixels, light-shielding members each formed at the boundary of adjacent color filter components, and lenses concave toward a light incident direction, each formed directly below a corresponding one of the color filter components by self-alignment with respect to a base layer.

In this solid-state imaging device, since the light-shielding member is formed at the boundary of adjacent color filter components, light incident on the respective color filter components is reflected and absorbed by the light-shielding member, such that light is not incident on adjacent color filter components. Since the lenses are respectively formed directly below the color filter components, incident light is focused by the lens, and there is no case where part of light is incident on adjacent pixels.

Yet another embodiment of the invention provides a method of manufacturing a solid-state imaging device. The method includes the steps of forming light-shielding members each at the upper part between adjacent pixels, selectively removing a base layer by self-alignment with the light-shielding members as a mask, burying a first insulating film having concave portions surrounded by sidewalls inclined at a predetermined angle in the removed portions by a high-density plasma deposition method, burying a second insulating film in the concave portions of the first insulating film to form lenses concave toward a light incident direction by self-alignment, and forming color filter components directly above the respective lenses between adjacent light-shielding members to form an on-chip color filter.

In this method of manufacturing a solid-state imaging device, the base layer is selectively removed with the light-shielding member as a mask, and the first insulating film is buried in the removed portions by the high-density plasma deposition method. The first insulating film buried by the high-density plasma deposition method has the concave portions surrounded by the inclined sidewalls, so if the second insulating film serving as a lens member is buried in the concave portions, the lenses are formed by self-alignment with the light-shielding members as a mask. That is, the lenses and the color filter components can be formed with no misalignment. Further, since the color filter components are formed after the light-shielding members are formed, the on-chip color filter having the light-shielding members can be formed at the boundary of adjacent color filter components.

Yet another embodiment of the invention provided a method of manufacturing a solid-state imaging device. The method includes the steps of selectively removing a base layer corresponding to photoelectric converters of a plurality of pixels to form concave portions, forming a first insulating film having concave portions surrounded by sidewalls inclined at a predetermined angle in the removed portions selectively removed by a high-density plasma deposition method, burying a second insulating film in the concave portions of the first insulating film to form lenses concave toward a light incident direction by self-alignment, selectively forming light-shielding members on surfaces between the photoelectric converters of the respective pixels, and forming color filter components surrounded by the light-shielding members directly above the lenses to form an on-chip color filter.

In this method of manufacturing a solid-state imaging device, the base layer is selectively removed, and the first insulating film is buried in the removed portions by the high-density plasma deposition method. The first insulating film buried by the high-density plasma deposition method has the concave portions surrounded by the inclined sidewalls, so if the second insulating film serving as a lens member is buried in the concave portions, the lenses are formed by self-alignment with respect to the base layer. Thereafter, the light-shielding members are formed, and the color filter components surrounded by the light-shielding members are formed, thereby forming the on-chip color filter having the light-shielding members at the boundary of adjacent color filter components.

Yet another embodiment of the invention provides an electronic apparatus. The electronic apparatus includes a solid-state imaging device, an optical system guiding incident light to photoelectric converters of the solid-state imaging device, and a signal processing circuit processing an output signal of the solid-state imaging device. The solid-state imaging device has an on-chip color filter having color filter components formed to correspond to pixels, light-shielding members formed at the boundary of adjacent color filter components, and solid-state imaging device each having a concave lens formed directly below a corresponding one of the color filter components by self-alignment.

In this electronic apparatus, in the solid-state imaging device, the light-shielding members are provided at the boundary of adjacent color filter components, and the lenses are respectively formed directly below the color filter components by self-alignment. With this configuration, light incident on the respective color filter components is reflected and absorbed by the light-shielding members, such that light is not incident on adjacent color filter components. Further, light having transmitted the color filter components is focused by the lenses, such that light is prevented from being incident on adjacent pixels.

With the solid-state imaging device according to the embodiments of the invention, even if pixels are reduced in size, color mixture can be suppressed.

With the method of manufacturing a solid-state imaging device according to the embodiments of the invention, a solid-state imaging device can be manufactured which is capable of suppressing color mixture even if pixels are reduced in size.

With the electronic apparatus according to the embodiments of the invention, color mixture is suppressed in the solid-state imaging device, so a high-quality electronic apparatus can be provided.

BRIEF DESCRIPTION OF THE DRAWINGS

FIGS. 3A and 3B are a first set of manufacturing process views showing an example of a method of manufacturing a solid-state imaging device according to the first embodiment.

FIGS. 5A and 5B are a third set of manufacturing process views showing an example of a method of manufacturing a solid-state imaging device according to the first embodiment.

FIGS. 6A and 6B are a fourth set of manufacturing process views showing an example of a method of manufacturing a solid-state imaging device according to the first embodiment.

DETAILED DESCRIPTION OF THE INVENTION

Hereinafter, a mode for carrying out the invention (hereinafter, referred to as embodiment) will be described. The description will be provided in the following sequence.
1. Example of schematic configuration of MOS solid-state imaging device
2. First Embodiment (example of configuration of surface irradiation type MOS solid-state imaging device and example of manufacturing method thereof)
3. Second Embodiment (example of configuration of surface irradiation type MOS solid-state imaging device)
4. Third Embodiment (example of configuration of surface irradiation type MOS solid-state imaging device)
5. Fourth Embodiment (example of configuration of surface irradiation type MOS solid-state imaging device)
6. Fifth Embodiment (example of configuration of surface irradiation type MOS solid-state imaging device)
7. Sixth Embodiment (example of configuration of surface irradiation type MOS solid-state imaging device)
8. Seventh Embodiment (example of configuration of surface irradiation type MOS solid-state imaging device)
9. Eighth Embodiment (example of configuration of surface irradiation type MOS solid-state imaging device and example of manufacturing method thereof)
10. Ninth Embodiment (example of configuration of surface irradiation type MOS solid-state imaging device)
11. Tenth Embodiment (example of configuration of back irradiation type MOS solid-state imaging device)
12. Eleventh Embodiment (example of configuration of CCD solid-state imaging device)
13. Twelfth Embodiment (example of configuration of electronic apparatus)

<1. Example of Schematic Configuration of Mos Solid-State Imaging Device>

Figure 1:
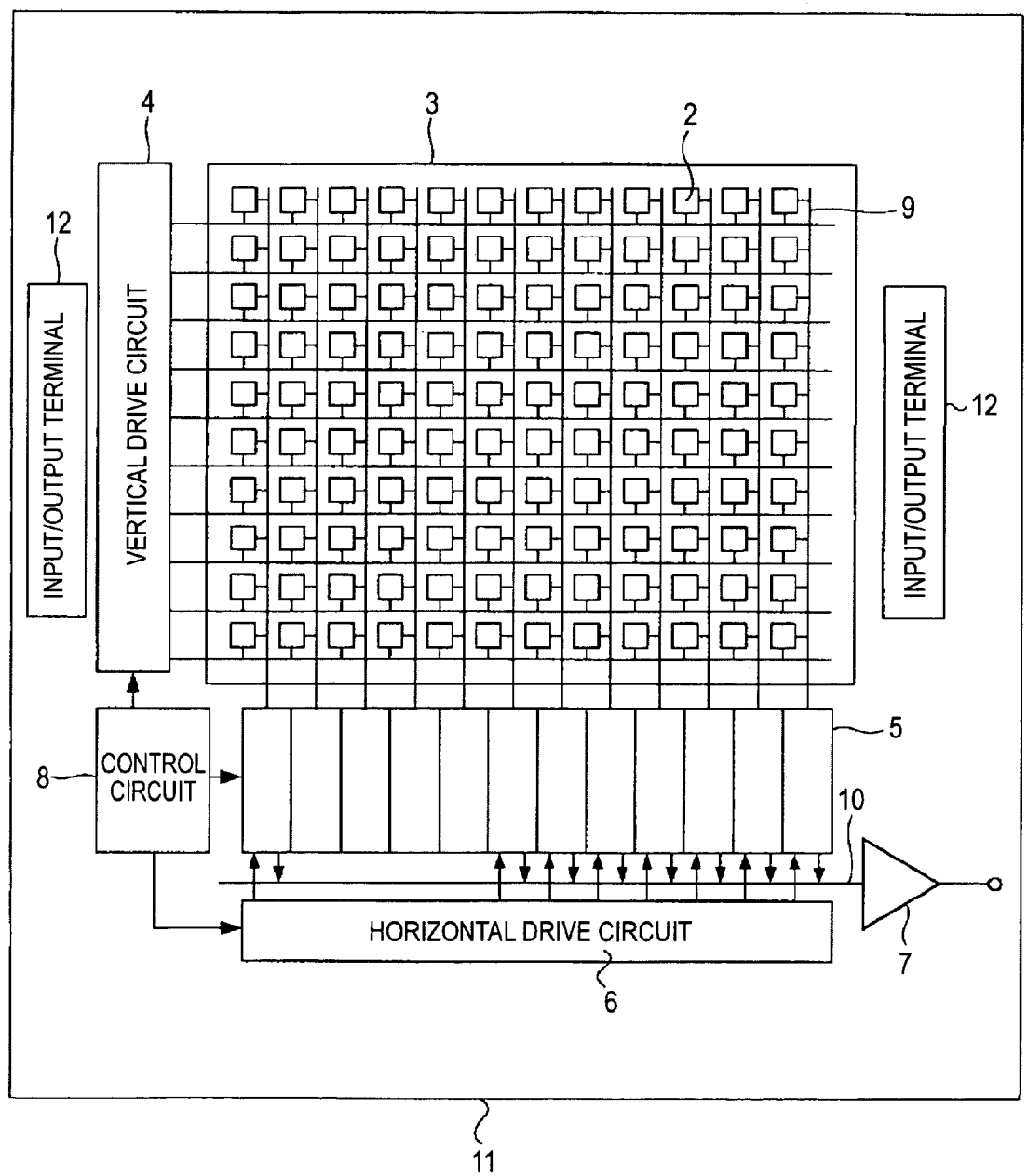
FIG. 1 is a diagram showing the schematic configuration of a solid-state imaging device which is applied to respective embodiments of the invention.

FIG. 1 shows the schematic configuration of an example a MOS solid-state imaging device which is applied to respective embodiments of the invention. As shown in FIG. 1, the solid-state imaging device 1 has a pixel section (so-called imaging area) 3 where a plurality of pixels 2 with photoelectric converters are arranged regularly in a two-dimensional array on a semiconductor substrate 11, for example, a silicon substrate, and a peripheral circuit section. Each pixel 2 has a photodiode serving as a photoelectric converter and a plurality of pixel transistors (so-called MOS transistors). The plurality of pixel transistors may include, for example, three transistors of a transfer transistor, a reset transistor, and an amplification transistor. Alternatively, the plurality of pixel transistors may include four transistors which include a selection transistor in addition to the three transistors. An equivalent circuit of a unit pixel is the same as that of the normal unit pixel, and the detailed description thereof will not be provided. Each pixel 2 may form a single unit pixel . Alternatively, the pixels 2 may have a shared pixel structure. The pixel sharing structure includes a plurality of photodiodes, a plurality of transfer transistors, a shared single floating diffusion, and alternately shared different pixel transistors. That is, in a shared pixel, photodiodes and transfer transistors constituting a plurality of unit pixels alternately share different pixel transistors.

The peripheral circuit section has a vertical drive circuit 4, column signal processing circuits 5, a horizontal drive circuit 6, an output circuit 7, a control circuit 8, and the like.

The control circuit 8 receives an input clock and data instructing an operation mode or the like, and outputs data, such as internal information of the solid-state imaging device. That is, the control circuit 8 generates clock signals or control signals for the operations of the vertical drive circuit 4, the column signal processing circuits 5, the horizontal drive circuit 6, and the like on the basis of a vertical synchronizing signal, a horizontal synchronizing signal, and a master clock. Then, the control circuit 8 outputs the signals to the vertical drive circuit 4, the column signal processing circuits 5, the horizontal drive circuit 6, and the like.

The vertical drive circuit 4 is formed by, for example, a shift register. The vertical drive circuit 4 selects a pixel drive line, supplies a pulse for driving pixels to the selected pixel drive line to drive pixels in rows. That is, the vertical drive circuit 4 sequentially selects and scans the pixels 2 of a pixel area 3 in rows in a vertical direction, and supplies a pixel signal based on signal charges generated in accordance with the amount of light received by a photodiode serving as a photoelectric converter of each pixel 2 to a corresponding one of the column signal processing circuits 5 through a vertical signal line 9.

The column signal processing circuits 5 are arranged, for example, for the respective columns of the pixels 2. The column signal processing circuits 5 perform signal processing, such as noise removal, on signals output from the pixels 2 of one row for the respective pixel columns. That is, the column signal processing circuits 5 performs signal processing, such as CDS for removing fixed pattern noise inherent in the pixels 2, signal amplification, or AD conversion. At the output stage of each of the column signal processing circuits 5, a horizontal selection switch (not shown) is provided and connected to a horizontal signal line 10.

The horizontal drive circuit 6 is formed by, for example, a shift register. The horizontal drive circuit 6 sequentially outputs horizontal scanning pulses to sequentially select the column signal processing circuits 5, and outputs a pixel signal from each of the column signal processing circuit 5 to the horizontal signal line 10.

The output circuit 7 performs signal processing on the signal sequentially supplied from each of the column signal processing circuits 5 through the horizontal signal line 10, and outputs the processed signal. For example, buffering may only be performed, or black level adjustment, column variation correction, and various kinds of digital signal processing may be performed. Input/output terminals 12 are provided to communicate signals with the outside.

<2. First Embodiment>
[Example of Configuration of Surface Irradiation Type MOS Solid-State Imaging Device]

Figure 2:
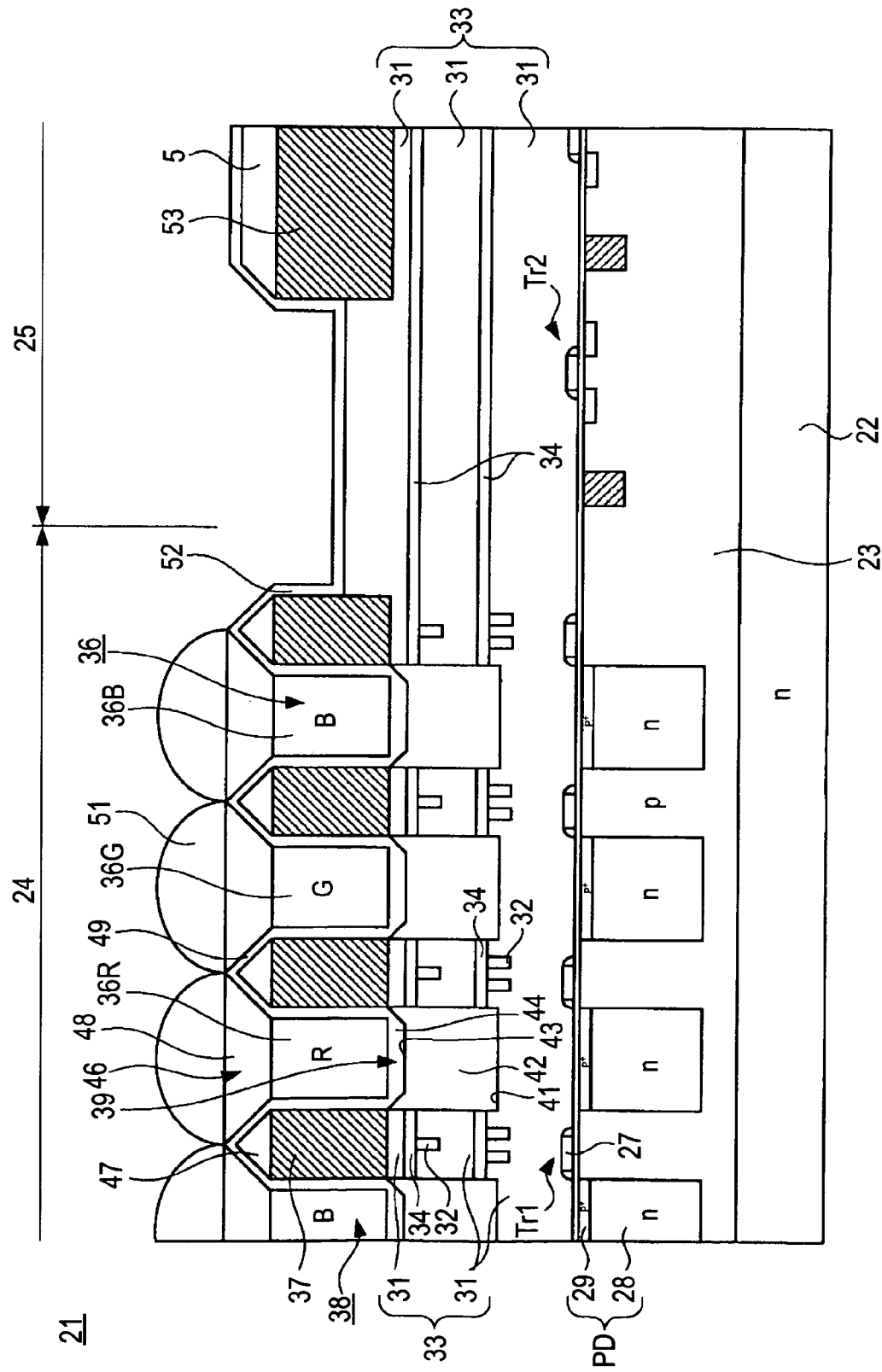
FIG. 2 is a diagram showing the schematic configuration of a main part of a solid-state imaging device according to a first embodiment of the invention.

FIG. 2 shows a solid-state imaging device according to a first embodiment of the invention. A solid-state imaging device of this embodiment is a surface irradiation type MOS solid-state imaging device. FIG. 2 shows a main part of a pixel section and a peripheral circuit section of the solid-state imaging device. A solid-state imaging device 21 according to the first embodiment has a semiconductor substrate where a second conduction type (for example, p-type) semiconductor well area 23 is formed in a first conduction type (for example, n-type) semiconductor substrate. (silicon substrate) 22. Photodiodes PD serving as photoelectric converters and a plurality of pixel transistors are formed on a pixel area 24 side of the p-type semiconductor well area 23 to correspond to the areas of respective unit pixels. A plurality of pixels are formed in a two-dimensional array. In FIG. 2, a plurality of pixel transistors are represented by a transfer transistor Tr1 having a transfer gate electrode 27.

Each of the photodiodes PD has an n-type semiconductor area 28 and a surface-side p-type semiconductor area 29. The p-type semiconductor area also serves as a hole accumulation area for suppressing dark current. A multilayer wiring layer 33 having multiple layers (in this embodiment, two layers) of wiring 32 are formed on the areas of the pixels arranged in the two-dimensional array through interlayer insulating films 31. The interlayer insulating films 31 are formed of, for example, a silicon oxide film. The wiring 32 is formed of, for example, a copper (Cu) wiring. A barrier metal film (not shown) for preventing diffusion of the Cu wiring is formed on the lower surface and the side surface of the wiring 32, and a barrier metal film 34 is formed on the upper surface of the wiring 32. The barrier metal film 34 is formed of SiC, SiN, TiN, or the like. In this embodiment, the barrier metal film 34 is formed of a SiC film.

The wiring 32 including the barrier metal film 34 is not formed in portions corresponding to the photodiodes PD. Color filter components 36 [36R, 36G, and 36B] of red (R), green (G), and blue (B) are formed on the multilayer wiring layer 33 corresponding to the photodiodes PD, and light-shielding members 37 are respectively formed at the boundary of adjacent color filter components 36. That is, the color filter components 36R, 36G, and 36B are formed so as to be filled in the lattice-shaped light-shielding members 37 in plan view. An on-chip color filter 38 includes the color filter components 36R, 36G, and 36B surrounded by the light-shielding members 37.

First lenses 39 concave toward a light incident direction (downward convex lenses) are respectively formed directly below the color filter components 36 [36R, 36G, and 36B] by self-alignment with the light-shielding members 37 as a mask. The first downward convex lenses 39 directly below the color filter components 36 correspond to in-layer lenses. At the time of formation of the downward convex lenses 39, which will be described below, a base layer is selectively removed by etching with the light-shielding members 37 as a mask to form concave portions 41. A first insulating film 42 is buried in the concave portions 41 by using a high-density plasma (HDP) deposition method. The HDP deposition method is a deposition method which forms a film by accumulating while sputtering. For this reason, at the time of deposition into the stepped concave portions, the first insulating film 42 is formed so as to have concave portions 43 surrounded by sidewalls inclined at a predetermined angle. The inclined sidewalls have an angle of about 45 degrees. The first insulating film 42 is formed of, for example, a light transmissive silicon oxide film.

A second insulating film 44 having a planarized surface is buried in the concave portions 43 of the first insulating film 42, such that the first downward convex lenses 39 are formed by self-alignment. The second insulating film 44 is a film serving as a lens member, and may be formed of a light transmissive silicon nitride film having a refractive index higher than the first insulating film 42.

Second lenses 46 concave toward a light incident direction (downward convex lenses) are respectively formed directly on the color filter components 36R, 36G, and 36B by self-alignment. At the time of formation of the downward convex lenses 46, which will be described below, at the same time the first insulating film 42 having the concave portions 43 of the first downward convex lenses 39 is formed by the HDP deposition method, a frame-shaped first insulating film 47 having sidewalls at a predetermined angle is formed on the light-shielding members 37. The first insulating film 47 are formed to have a frame shape surrounding the respective color filter components 36 in plan view, and to have the same lattice shape as the light-shielding members 37 as a whole. The inclined sidewalls have an angle of about 45 degrees. In this embodiment, the frame-shaped first insulating film 47 having a triangular sectional shape is formed to be self-aligned with respect to the light-shielding members 37. A second insulating film 48 having a planarized surface is formed in concave portions 49 surrounded by the frame-shaped first insulating film 47, such that the second downward convex lenses 46 are formed. In the same manner as described above, the light-transmissive first insulating film 47 may be formed of a silicon oxide film, and the light-transmissive second insulating film 48 serving as a lens member may be formed of a silicon nitride film.

A light-resistance film 52 is formed so as to cover the light-shielding members 37 including the frame-shaped first insulating film 47. In particular, when the light-shielding member 37 is formed of aluminum (Al), if the light-shielding members 37 made of aluminum are exposed to light, the light-shielding members 37 may be corroded. The light-resistant film 52 prevents the light-shielding members 37 made of Al from being corroded. The light-resistant film 52 may be formed of, for example, a silicon nitride film.

The light-shielding members 37 are formed of a light-shielding film including light absorption and light reflection, or a light-reflective film. The light-shielding members 37 are formed of a heat-resistant film. The light-shielding members 37 are preferably formed of a film of material for micromachining. The light-shielding members 37 may be formed of a film of aluminum (Al), tungsten (W), or the like, which is widely used. The light-shielding members 37 are formed within the width of the wiring 32 between the photodiodes PD, and accurately, the width of the barrier metal film 34.

So-called gapless on-chip microlenses 51 with no gap between adjacent lenses are formed on the respective downward convex lenses 46 so as to terminate at the apex of the triangular sectional shape of the respective light-shielding members 37.

In this embodiment, the wiring 32 corresponding to the pixel section 24 is formed of two-layered metal. In order to ensure sensitivity with the reduction in size of pixels, it is necessary to make the distance between the photodiode PD and the on-chip microlenses 51 as short as possible.

On the other hand, a transistor Tr2 including an n-channel MOS transistor, a p-channel MOS transistor, and the like is formed on the peripheral circuit section 25 side of the p-type semiconductor well area 23. A multilayer wiring layer 33 is also formed in the peripheral circuit section 25, and a light-shielding layer 53 is formed on the multilayer wiring layer 33. The light-shielding layer 53 is formed simultaneously with the light-shielding members 37.

With the solid-state imaging device 21 of the first embodiment, the light-shielding members 37 are respectively formed at the boundary of the color filter components 36 [36R, 36G, and 36B] of the on-chip color filter 38, so color mixture between the color filter components 36 can be suppressed. That is, light which passes through the on-chip microlenses 51 and are incident on the on-chip color filter 38 is reflected or absorbed by the light-shielding members 37 formed between the color filter components 36 such that light is not incident on adjacent color filter components 36. Therefore, color mixture between the color filter components 36 is prevented. Intrinsically, the wiring 32 including the barrier metal film 34 is arranged at the upper part between the photodiodes PD, so even though the light-shielding members 37 are formed at the upper part of the wiring 32, the light-shielding members 37 are within the width of the wiring 32 and the barrier metal film 34, there is no case where sensitivity is reduced.

The first downward convex lenses 39 are respectively formed directly below the color filter components 36, and the downward convex lenses 39 are buried near the photodiodes PD. Therefore, light incident from the on-chip microlenses 51 passes through the first downward convex lenses 39 and are incident on the photodiodes PD, so color mixture is unlikely to occur. That is, light having passed through the color filter components 36 is focused by the first downward convex lenses 39, and there is no case where part of light is incident on adjacent photodiodes PD through between the wiring 32.

The second downward convex lenses 46 are respectively formed directly above the color filter components 36R, 36G, and 36B. The second downward convex lenses 46 focus light which is being incident on the color filter components 36 from the on-chip microlenses 51 and causes light to be incident on the color filter components 36. Thus, the second downward convex lenses 46 contribute to color mixture suppression and focusing. In this embodiment, the downward convex lenses 46 and 39 are provided above and below the color filter components 36, so color mixture can be further suppressed and focusing efficiency can be further improved.

The first downward convex lenses 39 are formed by self-alignment with the light-shielding members 37 as a mask, and the second downward convex lenses 46 are also formed by self-alignment. The color filter components 36 are also formed by self-alignment with respect to the light-shielding members 37. Therefore, there is no misalignment between the color filter components 36 and the first and second downward convex lenses 39 and 46 with the color filter components 36 interposed therebetween. If there is slight misalignment or displacement with the reduction in size of pixels, misalignment or displacement affects spectral characteristics, sensitivity characteristics, and the like. In this embodiment, since there is no misalignment between the color filter components 36, the first downward convex lenses 39 and the second downward convex lenses 46, the reduction in size of pixels has no affect spectral characteristics, sensitivity characteristics, and the like.

The light-shielding members 37 are provided between adjacent color filter components 36, so the color filter components 36 can be formed to have a large thickness. When the color filter components have a large thickness, the spectral characteristics are improved.

The light-shielding members 37 are covered with the light-resistance film 52, so the light-shielding members 37 can be prevented from being deteriorated. When the light-shielding members 37 are formed of an Al film having poor light resistance, the light-shielding members 37 made of Al maybe corroded due to incident light, and the light shielding property may be deteriorated. Even if the light-shielding members 37 are formed of an Al film, the light-resistant film 52 made of a plasma silicon nitride film can prevent the light-shielding members 37 from being corroded, and thus the light shielding property can be maintained even in the case of the use for a long time.

The on-chip microlenses 51 are formed as so-called gapless on-chip microlenses with no gap between adjacent lenses such that each lens terminates at the apex of the frame-shaped first insulating film 47 having a triangular sectional shape. Therefore, the use efficiency of the amount of incident light can be further improved.

The solid-state imaging device 21 of the first embodiment can obtain a high-quality image suppressing color mixture even though the pixels are reduced in size.

[Example of Method of Manufacturing Surface Irradiation Type Mos Solid-State Imaging Device]

FIGS. 3A to 6B show an example of a method of manufacturing the solid-state imaging device 21 according to the first embodiment. In the respective drawings, a semiconductor substrate side where the photodiodes PD, the pixel transistors, and the peripheral circuit section are formed is not shown, and only the sectional structure of a main part where the on-chip microlenses, the on-chip color filter, and the downward convex lenses are formed is shown.

Though not shown, in this embodiment, first, the unit pixels each having the photodiode PD and the pixel transistors are formed in a two-dimensional array in a pixel section forming area 241 of the semiconductor substrate. Predetermined electric circuits, such as logic circuits, are formed in a peripheral circuit section forming area 251 of the semiconductor substrate. Next, as shown in FIG. 3A, multiple layers (in this embodiment, two layers) of wiring 32 and the barrier metal films 34 are formed through the interlayer insulating films 31 to form the multilayer wiring layer 33. In this embodiment, the interlayer insulating films 31 are formed of, for example, a silicon oxide film. The respective layers of wiring 32 are formed on the areas between the photodiodes PD. The respective layers of barrier metal films 34 are formed over the entire area including the pixel section forming area 241 and the peripheral circuit section forming area 251. A light-shielding member material film 37a is formed on the uppermost interlayer insulating film 31. The light-shielding member material film 37a is formed of metal, such as aluminum (Al) or tungsten (W), or a light-reflective or light-absorbent film. In this embodiment, an aluminum film is used.

Next, as shown in FIG. 3B, a thin material film 55a serving as a hard mask, in this embodiment, a silicon oxide film, is formed on the light-shielding member material film 37a, and a resist mask 56 having a predetermined pattern is formed on the silicon oxide film 55a. In the pixel section forming area 241, the resist mask 56 has a pattern in which portions for the light-shielding members are left, and portions corresponding to the photodiodes PD are open. The underlying silicon oxide film 55a is patterned through the resist mask 56 to form a hard mask 55. Next, the light-shielding member material film 37a is patterned by etching through the hard mask 55. Thus, the light-shielding members 37 are formed at the portions between the photodiodes PD. In the peripheral circuit section forming area 251, through the patterning, the light-shielding layer 53.

The light-shielding member material film 37a is patterned through the hard mask 55, so the light-shielding members 37 having a large thickness and a fine pattern can be formed.

Figure 4A:
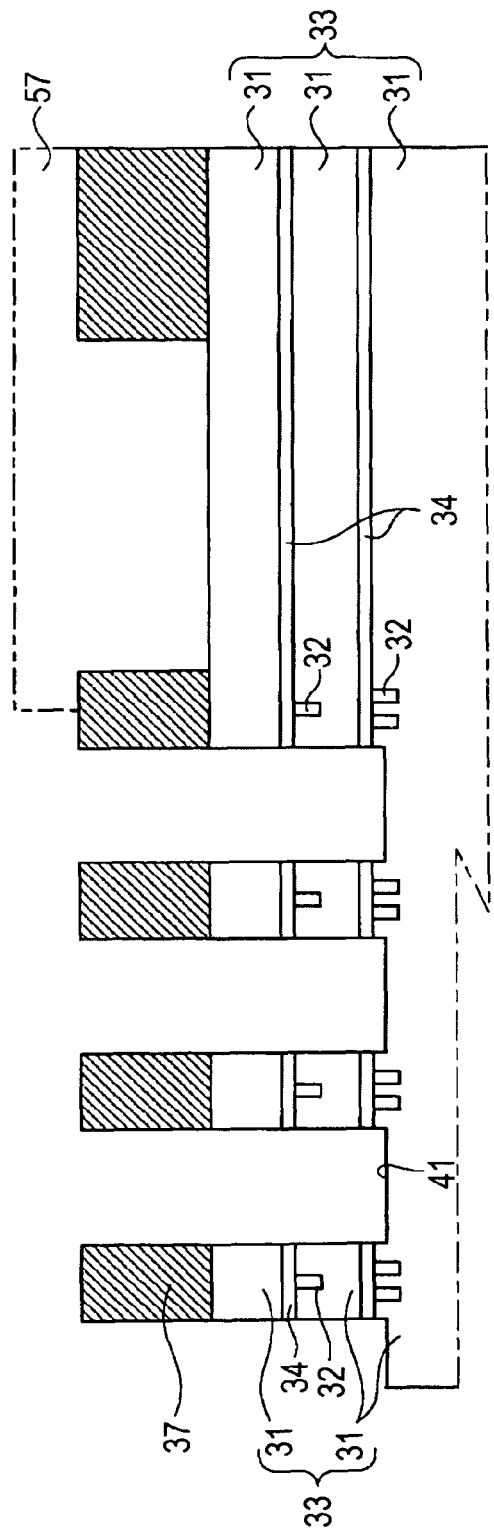
FIGS. 4A and 4B are a second set of manufacturing process views showing an example of a method of manufacturing a solid-state imaging device according to the first embodiment.

Next, as shown in FIG. 4A, in a state where the peripheral circuit section forming area 251 is covered with a resist mask 57, the underlying interlayer insulating film 31 and barrier metal film 34 are selectively etched with the light-shielding members 37 as a mask to form the concave portions 41 having a predetermined depth. In this embodiment, the interlayer insulating film 31 and the barrier metal film 34 are removed by etching near the first layer of wiring 32.

Figure 4B:
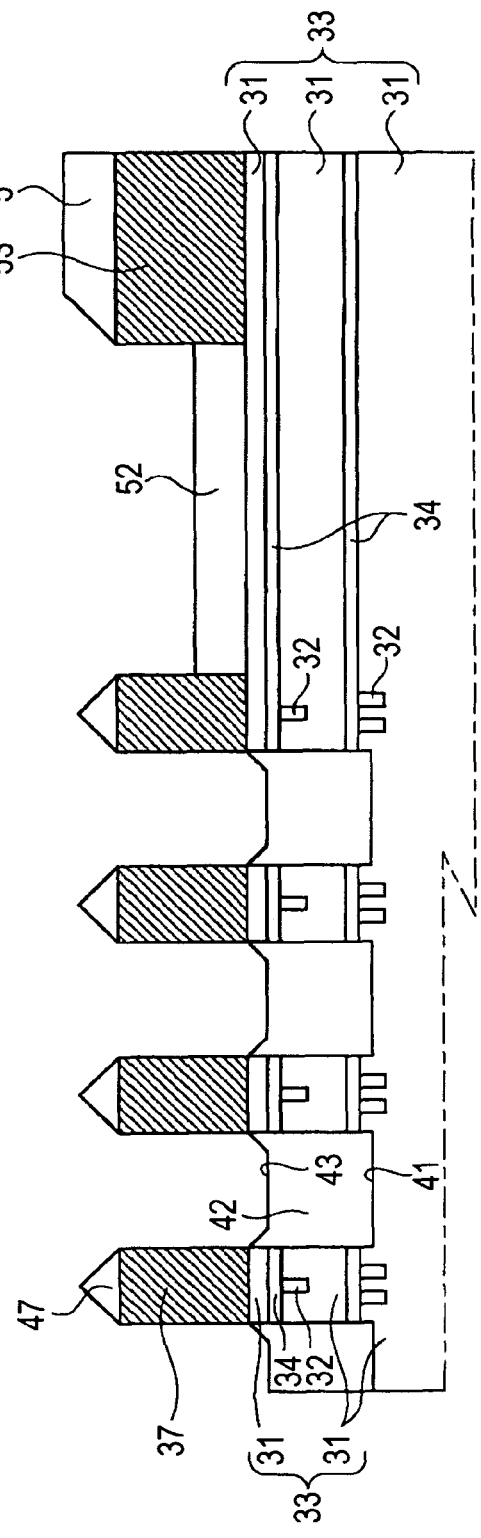

Next, as shown in FIG. 4B, the first insulating film 42, in this embodiment, a silicon oxide film, is buried in the concave portions 41 by a high-density plasma (HDP) deposition method. Since there are steps, the film is accumulated while being sputtered, and the first insulating film 42 is buried such that concave portions 44 serving as sidewalls inclined at a predetermined angle, in this embodiment, at about 45 degrees, are provided at the upper edges of the respective concave portions 41. Simultaneously, the first insulating film 47, in this embodiment, the same silicon oxide film, is formed on the light-shielding members 37 to have a triangular sectional shape at an inclination angle of about 45 degrees. An upper edge of each of the concave portions 44 terminates at the lower edge of a corresponding one of the light-shielding members 37. The second insulating film 47 is formed on the light-shielding members 37 in a lattice shape in plan view. Thus, the second insulating film 47 is formed to have a frame shape in a unit area corresponding to each photodiode PD. There is no step on the light-shielding layer 53 of the peripheral circuit section forming area 251, so the second insulating film 42 having a planarized surface is formed.

Next, as shown in FIG. 5A, in the pixel section forming area 241, the second insulating film 39 having a planarized surface and serving as a lens member, in this embodiment, a silicon nitride film, is buried in the concave portions 44 of the first insulating film 42. Thus, the first downward convex lenses 39 are formed.

Next, as shown in FIG. 5B, the film 52 having light resistance along the surface, in this embodiment, a silicon nitride film, is formed so as to cover the light-shielding members 37 and the overlying first insulating film 47 having a triangular sectional view. The light-resistant film 52 is formed on the entire surface including the peripheral circuit section forming area 251.

Next, as shown in FIG. 6A, the color filter components 36R, 36G, and 36B are respectively filled in the portions surrounded by the light-shielding members 37, that is, the portions corresponding to the photodiodes PD, thereby forming the on-chip color filter 38. The color filter components 36 can be formed to have a thickness equal to the height of the light-shielding members 37. The color filter components 36 [36R, 36G, and 36B] may be, for example, primary color filter components of red (R), green (G), and blue (B), or complementary color filter components.

In the step of FIG. 6A, concave portions 49 surrounded by the first insulating film 47 having a triangular sectional shape are respectively formed on the color filter components 36R, 36G, and 36B.

Next, as shown in FIG. 6B, the second insulating film 48 serving as a lens member is formed to bury the concave portions 49 and etched, and the surface of the second insulating film 48 is planarized. Thus, the second downward convex lenses 46 are formed. In this embodiment, the second insulating film 48 is formed of a silicon nitride film.

With regard to the second downward convex lenses 46 on the respective color filter components 36, the second insulating film 48 to be buried may have multiple layers having different refractive indexes. For example, a UV-silicon nitride film having a refractive index similar to the silicon oxide film, an overlying plasma silicon nitride film having a high refractive index, and an overlying UV-silicon nitride film having a low refractive index may be formed. A single layer of silicon nitride film may be used, but taking reflection into consideration, the three-layered silicon nitride film is preferably used. Thereafter, a photoresist film is deposited on the surface, and etching is performed to planarize the surface of the photoresist film.

Next, the on-chip microlenses 51 are formed on the surface at which the second downward convex lenses 46 are formed. The on-chip microlenses 51 are formed as gapless on-chip microlenses such that the lower edge of each lens terminates at the apex of the triangular sectional shape. In this way, the intended solid-state imaging device 21 according to the first embodiment is obtained.

With the method of manufacturing a solid-state imaging device of this embodiment, the solid-state imaging device 21 can be manufactured in which the color filter components 36 are surrounded by the light-shielding members 37, and the color filter components 36 are sandwiched between the second and first downward convex lenses 46 and 39 arranged above and below the color filter components 36 by self-alignment. That is, the solid-state imaging device 21 with fine pixels capable of suppressing occurrence of color mixture and obtaining an image with good image quality can be manufactured.

<3. Second Embodiment>
[Example of Configuration of Surface Irradiation Type MOS Solid-State Imaging Device]

Figure 7:
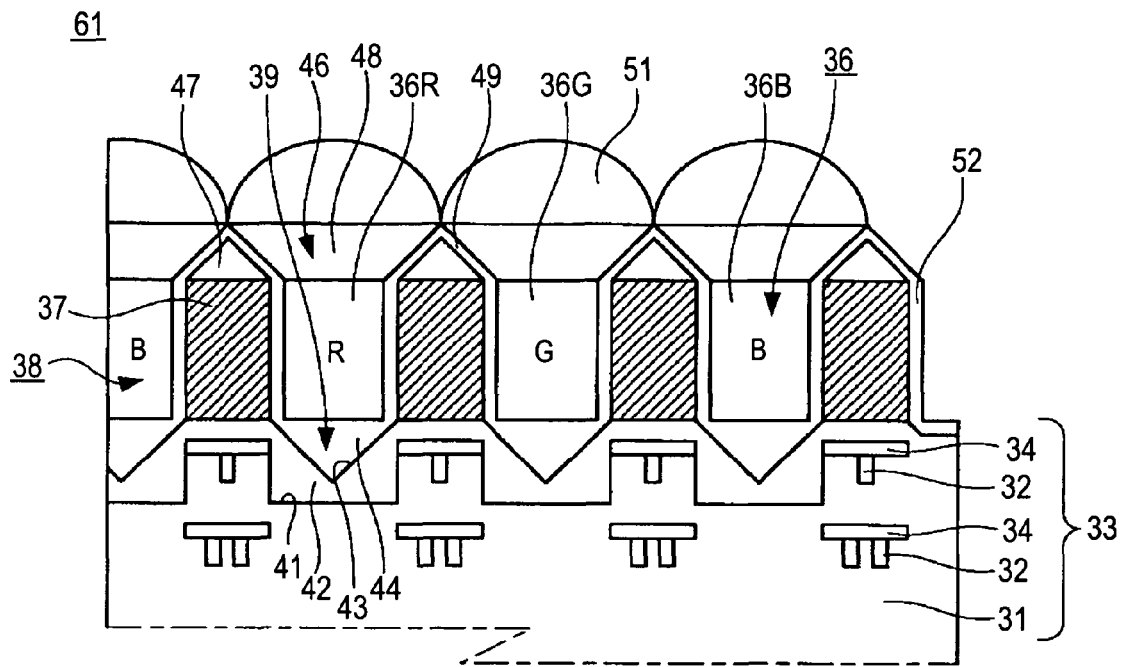
FIG. 7 is a diagram showing the schematic configuration of a main part of a solid-state imaging device according to a second embodiment of the invention.

FIG. 7 shows a solid-state imaging device according to a second embodiment of the invention. A solid-state imaging device of this embodiment is a surface irradiation type MOS solid-state imaging device. FIG. 7 shows a main part of a pixel section of the solid-state imaging device. As described above, a solid-state imaging device 61 of the second embodiment is structured such that an on-chip color filter 38 having color filter components 36 [36R, 36G, and 36B] of red, green, and blue is formed on a multilayer wiring layer 33, and light-shielding members 37 are respectively formed at the boundary of adjacent color filter components 36. First and second downward convex lenses 39 and 46 are formed above and below the color filter components 36R, 36G, and 36B by self-alignment. On-chip microlenses 51 are formed on the on-chip color filter 38.

In this embodiment, a second insulating film 44 constituting the first downward convex lenses 39 is formed to have a triangular sectional shape by self-alignment. Other parts are the same as those described in the first embodiment. Thus, the portions corresponding to FIG. 2 are represented by the same reference numerals, and overlap description will be omitted.

With the solid-state imaging device 61 of the second embodiment, the first downward convex lenses 39 formed by the second insulating film 44 having a triangular sectional shape also have a lens function, thereby focusing incident light on the photodiodes PD. In this embodiment, the light-shielding members 37 are respectively formed at the boundary of the color filter components 36 [36R, 36G, and 36B] of the on-chip color filter 38. Thus, color mixture between the color filter components 36 can be suppressed. Further, the first downward convex lenses 39 are buried near the photodiodes PD, as compared with the first embodiment, so incident light is reliably focused and there is no case where light is incident on adjacent pixels. Therefore, the solid-state imaging device 61 of this embodiment can suppress color mixture and obtain an image with high image quality even though pixels are reduced in size.

In addition, the same effects as those described in the first embodiment can be obtained.

<4. Third Embodiment>

[Example of Configuration of Surface Irradiation Type MOS Solid-State Imaging Device]

Figure 8:
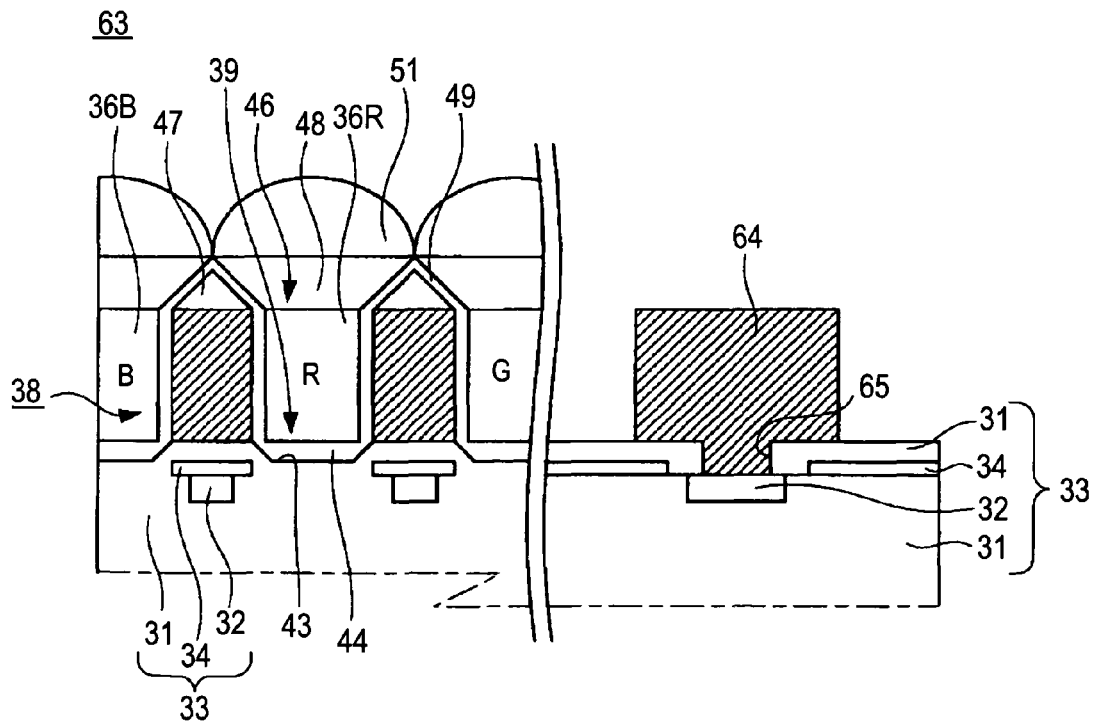
FIG. 8 is a diagram showing the schematic configuration of a main part of a solid-state imaging device according to a third embodiment of the invention.

FIG. 8 shows a solid-state imaging device according to a third embodiment of the invention. A solid-state imaging device of this embodiment is a surface irradiation type MOS solid-state imaging device. FIG. 8 shows a main part of an area of a pixel section and an electrode pad section of the solid-state imaging device. A solid-state imaging device 63 of the third embodiment is configured such that, when light-shielding members 37 are formed of an aluminum (Al) film, an electrode pad section 64 of the solid-state imaging device is formed by using the aluminum (Al) film of the light-shielding members 37. That is, after a second layer of wiring 32 serving as an uppermost layer and a barrier metal film 34 are formed in a multilayer wiring layer 33, an interlayer insulating film 31a is formed of a silicon oxide film. The interlayer insulating film 31a corresponds to an uppermost interlayer insulating film. Thereafter, the first downward convex lenses 39 are formed, and the light-shielding members 37 and the electrode pad section 64 made of an aluminum (Al) film are formed.

As described in a subsequent embodiment, the light-shielding members 37 may be formed directly on the uppermost barrier metal film 34 and the interlayer insulating film 31 with the same plane as the surface of the barrier metal film 34. However, in simultaneously forming the electrode pad section 64 of the aluminum (Al) film of the light-shielding members 37, it is necessary to provide a silicon oxide film between the Al film serving as the electrode pad section 64 and the wiring 32 in advance. In this embodiment, the interlayer insulating film 31a is formed on the uppermost barrier metal film 34, such that the silicon oxide film 31a below the electrode pad section is simultaneously formed. The electrode pad section 64 is formed by forming a contact hole 65 in the silicon oxide film 31a and the barrier metal film 34 made of SiC, forming an Al film to include the contact hole 65, and patterning the Al film.

Other parts are the same as those described in the first embodiment. Thus, the portions corresponding to FIG. 2 are represented by the same reference numerals, and overlap description will be omitted.

With the solid-state imaging device 63 of the third embodiment, the light-shielding members 37 and the electrode pad section 64 are formed simultaneously, so the manufacturing process can be simplified. As described above, the light-shielding members 37 are respectively formed at the boundary of the color filter components 36R, 36G, and 36B of the on-chip color filter 38. Thus, color mixture between the color filter components 36 can be suppressed. Further, first downward convex lenses 39 are buried near the photodiodes PD, as compared with the first embodiment, so incident light is reliably focused and there is no case where light is incident on adjacent pixels. Therefore, the solid-state imaging device 63 of this embodiment can suppress color mixture and obtain an image with high image quality even though pixels are reduced in size.

In addition, the same effects as those described in the first embodiment can be obtained.

<5. Fourth Embodiment>

[Example of Configuration of Surface Irradiation Type MOS Solid-State Imaging Device]

Figure 9:
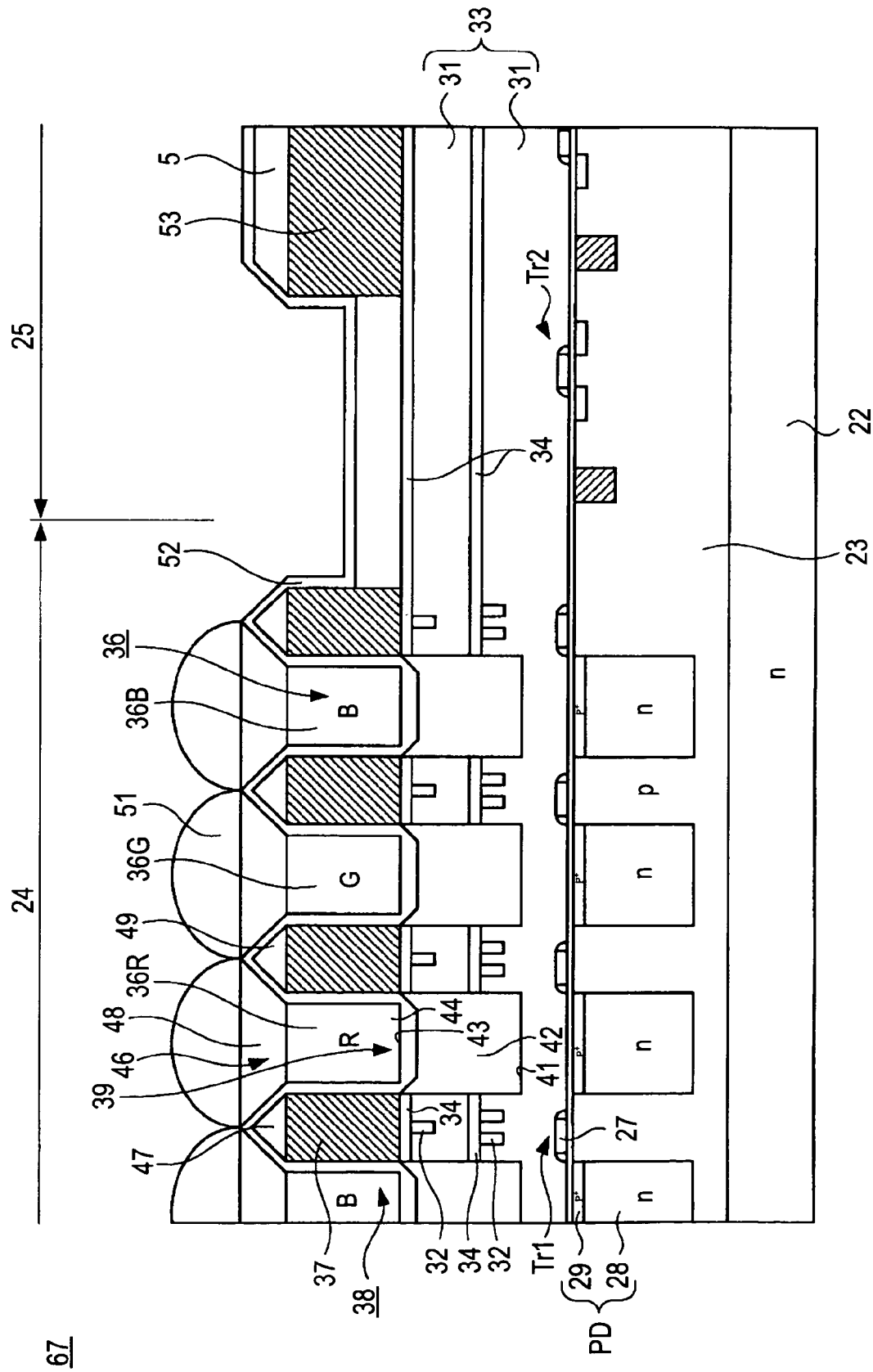
FIG. 9 is a diagram showing the schematic configuration of a main part of a solid-state imaging device according to a fourth embodiment of the invention.

FIG. 9 shows a solid-state imaging device according to a fourth embodiment of the invention. A solid-state imaging device of this embodiment is a surface irradiation type MOS solid-state imaging device. FIG. 9 shows a main part of a pixel section and a peripheral circuit section of the solid-state imaging device. A solid-state imaging device 67 of the fourth embodiment is structured such that a multilayer wiring layer 33 includes only an uppermost wiring 31 and a barrier metal film 34, and light-shielding members 37 are formed directly on the barrier metal film 34 and an interlayer insulating film 31 with the same plane as the surface of the barrier metal film 34. That is, in this embodiment, the interlayer insulating film 31 made of a silicon oxide film formed between the uppermost barrier metal film 34 and the light-shielding members 37 in the first embodiment is not provided.

Other parts are the same as those described in the first embodiment. Thus, the portions corresponding to FIG. 2 are represented by the same reference numerals, and overlap description will be omitted.

With the solid-state imaging device 67 of the fourth embodiment, the light-shielding members 37 are formed directly on the barrier metal film 34, and the interlayer insulating film 31 between the barrier metal film 34 and the light-shielding members 37 is not provided. As the interlayer insulating film 31 is not provided, the distance between the on-chip microlens 51 and the light-receiving surface of the photodiode PD is shortened, so color mixture can be further suppressed and focusing efficiency can be improved. As described above, the light-shielding members 37 are respectively formed at the boundary of the color filter components 36R, 36G, and 36B of the on-chip color filter 38. Thus, color mixture between the color filter components 36 can be suppressed. Therefore, the solid-state imaging device 67 of this embodiment can suppress color mixture and obtain an image with high image quality even though pixels are reduced in size.

In addition, the same effects as those described in the first embodiment can be obtained.

<6. Fifth Embodiment>

[Example of Configuration of Surface Irradiation Type MOS Solid-State Imaging Device]

Figure 10:
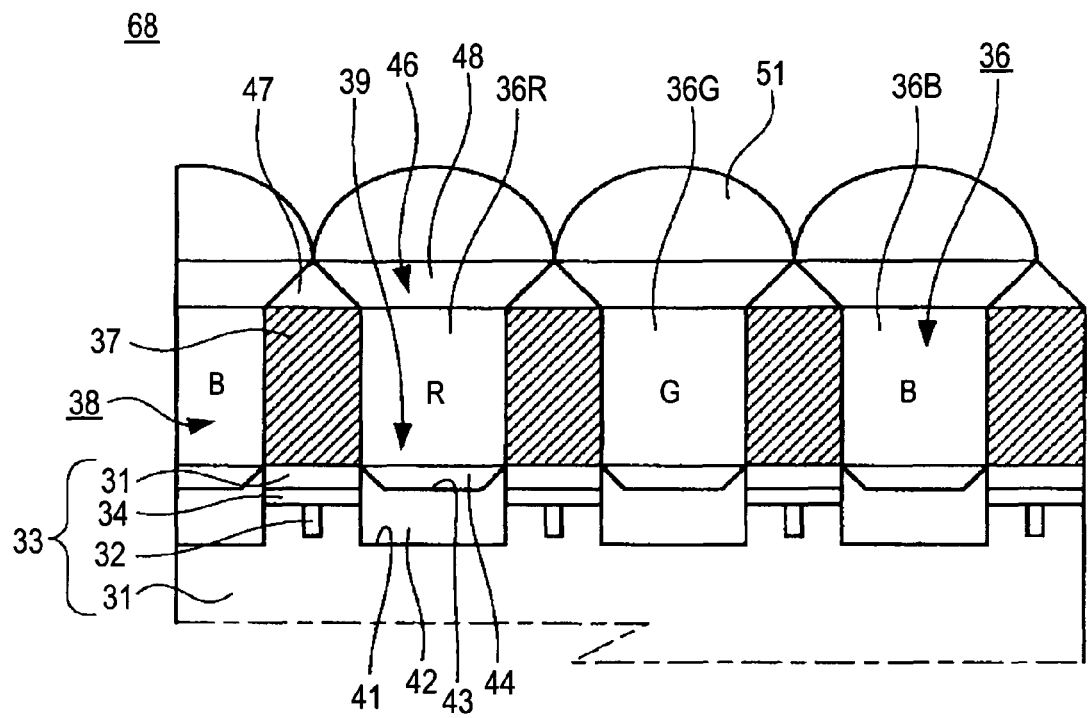
FIG. 10 is a diagram showing the schematic configuration of a main part of a solid-state imaging device according to a fifth embodiment of the invention.

FIG. 10 shows a solid-state imaging device according to a fifth embodiment of the invention. A solid-state imaging device of this embodiment is a surface irradiation type MOS solid-state imaging device. FIG. 10 shows a main part of a pixel section of the solid-state imaging device. A solid-state imaging device 68 of the fifth embodiment is configured such that light-shielding members 37 are formed of a tungsten (W) film having light resistance, and the light-resistant film 52 covering the light-shielding members 37 is not provided.

Other parts are the same as those described in the first embodiment. Thus, the portions corresponding to FIG. 2 are represented by the same reference numerals, and overlap description will be omitted.

With the solid-state imaging device 68 of the fifth embodiment, as the light-resistant film covering the light-shielding members 37 is not provided, the number of steps in the manufacturing process can be reduced, and manufacturing can be simplified. As described above, the light-shielding members 37 are respectively formed at the boundary of the color filter components 36R, 36G, and 36B of the on-chip color filter 38. Thus, color mixture between the color filter components 36 can be suppressed. Therefore, the solid-state imaging device 68 of this embodiment can suppress color mixture and obtain an image with high image quality even though pixels are reduced in size.

In addition, the same effects as those described in the first embodiment can be obtained.

<7. Sixth Embodiment>
[Example of Configuration of Surface Irradiation Type MOS Solid-State Imaging Device]

Figure 11:
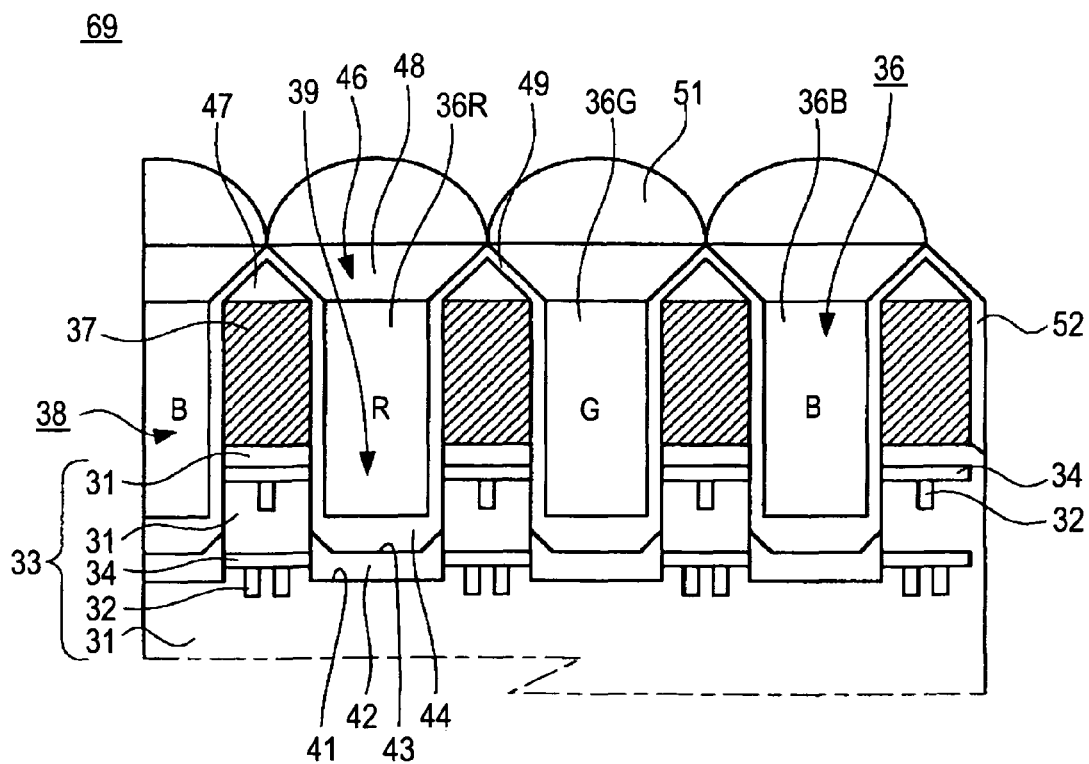
FIG. 11 is a diagram showing the schematic configuration of a main part of a solid-state imaging device according to a sixth embodiment of the invention.

FIG. 11 shows a solid-state imaging device according to a sixth embodiment of the invention. A solid-state imaging device of this embodiment is a surface irradiation type MOS solid-state imaging device. FIG. 11 shows a main part of a pixel section of the solid-state imaging device. A solid-state imaging device 69 of the fifth embodiment is structured such that first downward convex lenses 39 are formed below the lower surfaces of light-shielding members 37 so as to approach photodiodes PD (not shown), and color filter components 36R, 36G, and 36B approach the photodiodes PD as much. As the first downward convex lenses 39 approach the photodiodes PD, the thickness of each of the color filter components 36R, 36G, and 36B increases.

Other parts are the same as those described in the first embodiment and the fourth embodiment. Thus, the portions corresponding to FIGS. 2 and 9 are represented by the same reference numerals, and overlap description will be omitted.

With the solid-state imaging device 69 of the sixth embodiment, the color filter components 36 [36R, 36G, and 36B] are formed near the photodiodes PD, so color mixture can be further suppressed. As the color filter components' 36 increase in thickness, spectral characteristics are also improved. As described above, the light-shielding members 37 are respectively formed at the boundary of the color filter components 36R, 36G, and 36B of the on-chip color filter 38. Thus, color mixture between the color filter components 36 can be suppressed. Therefore, the solid-state imaging device 69 of this embodiment can suppress color mixture and obtain an image with high image quality even though pixels are reduced in size.

In addition, the same effects as those described in the first embodiment and the fourth embodiment can be obtained.

<8. Seventh Embodiment>
[Example of Configuration of Surface Irradiation Type MOS Solid-State Imaging Device]

Figure 12:
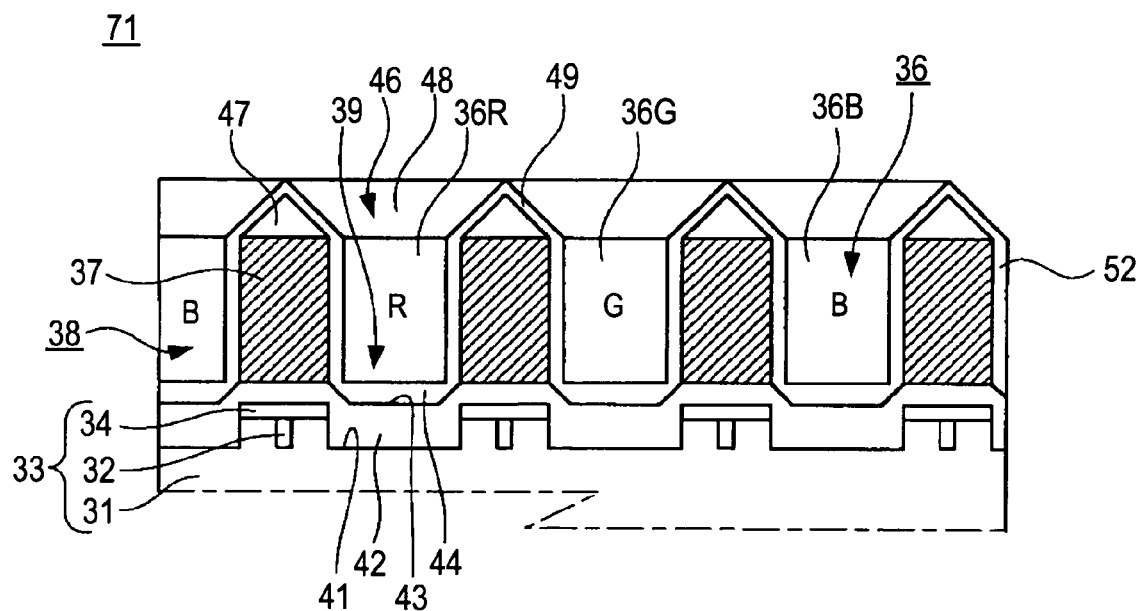
FIG. 12 is a diagram showing the schematic configuration of a main part of a solid-state imaging device according to a seventh embodiment of the invention.

FIG. 12 shows a solid-state imaging device according to a seventh embodiment of the invention. A solid-state imaging device of this embodiment is a surface irradiation type MOS solid-state imaging device. FIG. 12 shows a main part of a pixel section of the solid-state imaging device. A solid-state imaging device 71 of the seventh embodiment is configured such that an on-chip color filter 38 having light-shielding members 37 at the boundary of color filter components 36 is provided, first and second downward convex lenses 39 and 46 are provided by self-alignment, and on-chip microlenses 52 are not provided.

Other parts are the same as those described in the first embodiment. Thus, the portions corresponding to FIG. 2 are represented by the same reference numerals, and overlap description will be omitted.

With the solid-state imaging device 71 of the seventh embodiment, even if the on-chip microlenses are not provided, incident light can be focused by the second and first downward convex lenses 46 and 39, and with the light-shielding members 37, color mixture between the color filter components 36 can be suppressed. While part of incident light is shielded by the light-shielding members 37, since the light-shielding members 37 have a very small thickness, there is slight loss in incident light. The on-chip microlenses are not provided, so the configuration of the solid-state imaging device can be simplified, and the number of steps of the manufacturing process can be reduced.

On the other hand, it could be seen that, if pixels are further reduced in size, the on-chip microlenses do not function. If the on-chip microlenses are shorter than the wavelength of light, light is not bent and passes through the on-chip microlenses. In this embodiment, when pixels are further reduced in size, the on-chip microlenses are not provided, such that useless configuration can be omitted.

In addition, the same effects as those described in the first embodiment can be obtained.

<9. Eighth Embodiment>
[Example of Configuration of Surface Irradiation Type MOS Solid-State Imaging Device]

Figure 13:
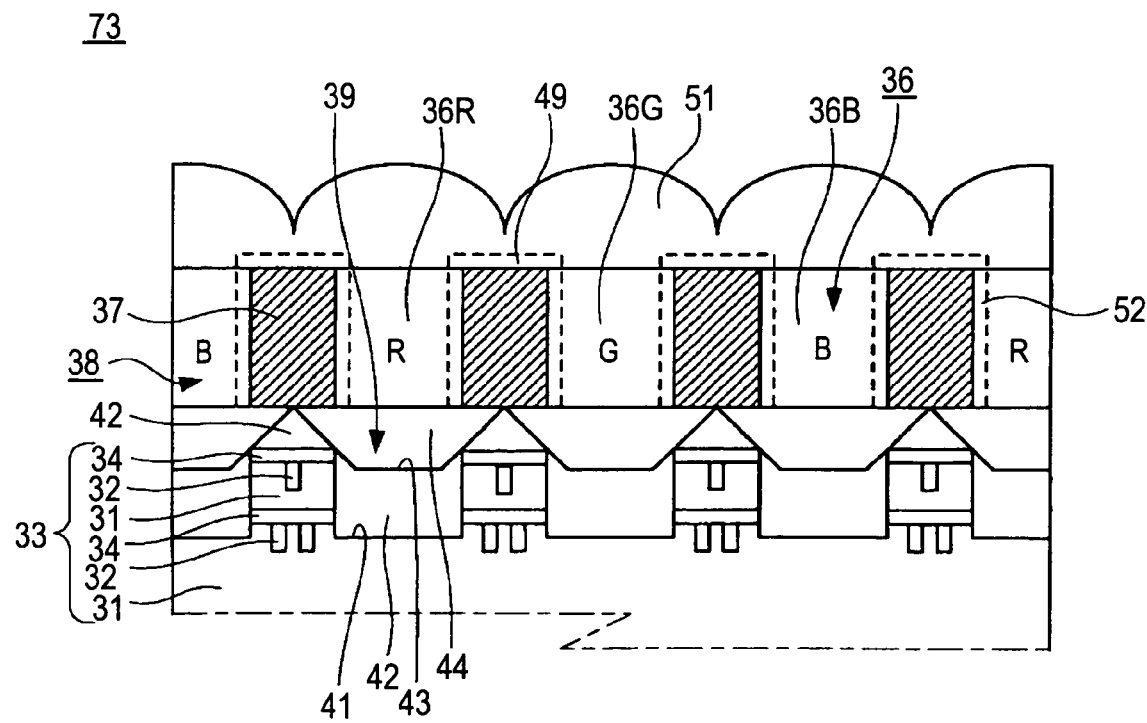
FIG. 13 is a diagram showing the schematic configuration of a main part of a solid-state imaging device according to an eighth embodiment of the invention.

FIG. 13 shows a solid-state imaging device according to an eighth embodiment of the invention. A solid-state imaging device of this embodiment is a surface irradiation type MOS solid-state imaging device. FIG. 13 shows a main part of a pixel section of the solid-state imaging device. A solid-state imaging device 73 of the eighth embodiment has an on-chip color filter 38 having color filter components 36 [36R, 36G, and 36B] formed to correspond to pixels, and light-shielding members 37 at the boundary of adjacent color filter components 36. In this embodiment, first downward convex lenses 39 are respectively formed directly below the color filter components 36 by self-alignment with respect to a base layer, and on-chip microlenses 51 are formed on the on-chip color filter 38.

That is, the solid-state imaging device 73 of this embodiment is configured such that the first downward convex lenses 39 are formed before the light-shielding members 37 are formed, and then the light-shielding members 37 and the color filter components 36 are formed. The above-described second downward convex lenses 46 are not formed on the color filter components 36R, 36G, and 36B. When the light-shielding members 37 are formed of, for example, tungsten (W), the light-resistant film 52 covering the surfaces of the light-shielding members 37 may not be provided. When the light-shielding members 37 are formed, for example, aluminum (Al), the surfaces of the light-shielding members 37 are preferably covered with the light-resistant film 52.

The first downward convex lenses 39 are formed as follows. After a multilayer wiring layer 33 is formed, portions of, an interlayer insulating film 31 corresponding to photodiodes PD are selectively removed by etching to form concave portions 41. Next, a first insulating film 42, in this embodiment, a silicon oxide film, is buried in the concave portions 41 by an HDP deposition method. At this time, as described above, the first insulating film 42 is formed such that concave portions 43 have sidewalls at about 45 degrees. Simultaneously, the triangular first insulating film 42 having an inclined surface at about 45 degrees is continuously formed on a barrier metal film 34 and the interlayer insulating film 31 with the same plane as the surface of the barrier metal film 34. The concave portions 43 of the first insulating film 42 are formed in a lattice shape in plan view. A second insulating film 44 having a planarized surface, in this embodiment, a silicon nitride film, is buried in the concave portions 43 of the first insulating film 42. Thus, the first downward convex lenses 39 are formed. That is, the first downward convex lenses 39 are formed by self-alignment with respect to the base layer having the concave portions 41, that is, the interlayer insulating film 31.

Other parts are the same as those described in the first embodiment. Thus, the portions corresponding to FIG. 2 are represented by the same reference numerals, and overlap description will be omitted.

With the solid-state imaging device 73 of the eighth embodiment, the light-shielding members 37 are respectively formed at the boundary of the color filter components 36 [36R, 36G, and 36B] of the on-chip color filter 38. Thus, color mixture between the color filter components 36 can be suppressed. Further, the first downward convex lenses 39 are provided, so incident light is reliably focused and there is no case where light is incident on adjacent pixels. Therefore, the solid-state imaging device 73 of this embodiment can suppress color mixture and obtain an image with high image quality even though pixels are reduced in size.

In addition, the same effects as those described in the first embodiment can be obtained.

[Example of Method of Manufacturing Surface Irradiation Type Mos Solid-State Imaging Device]

FIGS. 14A to 17B show an example of a method of manufacturing the solid-state imaging device 73 according to the eighth embodiment. In the respective drawings, a semiconductor substrate side where the photodiodes PD, the pixel transistors, and the peripheral circuit section are formed is not shown, and only the sectional structure of a main part where the on-chip microlenses, the on-chip color filter, and the downward convex lenses are formed is shown.

In this embodiment, though not shown, first, a plurality of unit pixels each having a photodiode PD and pixel transistors are formed in a two-dimensional array in a pixel section forming area of the semiconductor substrate. Predetermined electric circuits, such as logic circuits, are formed in a peripheral circuit section forming area of the semiconductor substrate.

Figure 14A:
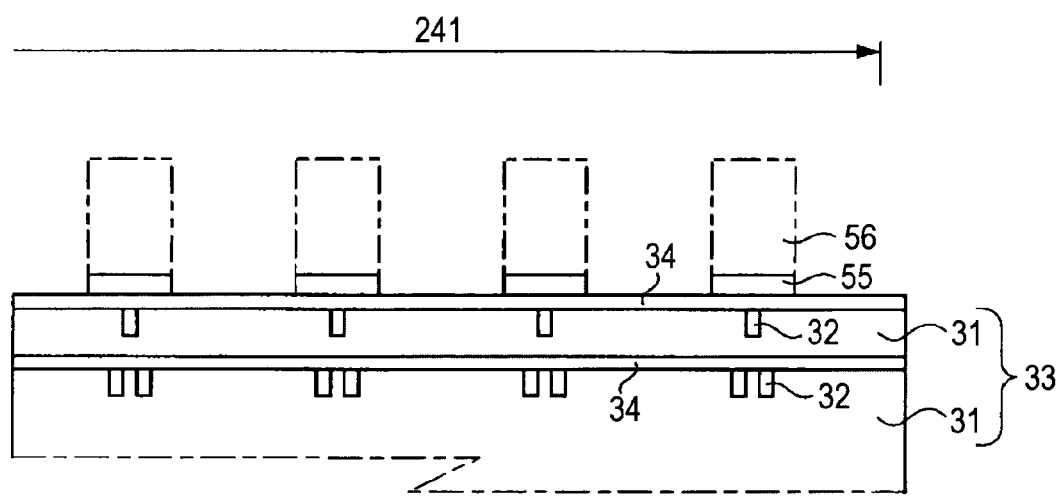
FIGS. 14A and 14B are a first set of manufacturing process views showing an example of a method of manufacturing a solid-state imaging device according to the eighth embodiment.

Next, as shown in FIG. 14A, multiple layers (in this embodiment, two layers) of wiring 32 and the barrier metal films 34 are formed through the interlayer insulating films 31 to form the multilayer wiring layer 33. In this embodiment, the interlayer insulating films 31 are formed of, for example, a silicon oxide film. The respective layers of wiring 32 are formed on the areas between the photodiodes PD. The respective layers of barrier metal films 34 are formed of a film of SiC, SiN, TiN, or the like, in this embodiment, a SiC film, over the entire area including the pixel section forming area 241 and the peripheral circuit section forming area (not shown).

Next, a thin material film 55a serving as a hard mask, in this embodiment, a silicon oxide film, is formed on the uppermost barrier metal film 34 of the multilayer wiring layer 33, and a resist mask 56 having a predetermined pattern is formed on the thin material film 55a. The resist mask 56 has a pattern such that the portions corresponding to the photodiodes PD are open. The underlying silicon oxide film is patterned through the resist mask 56 to form a hard mask 55 made of a silicon oxide film.

Figure 14B:
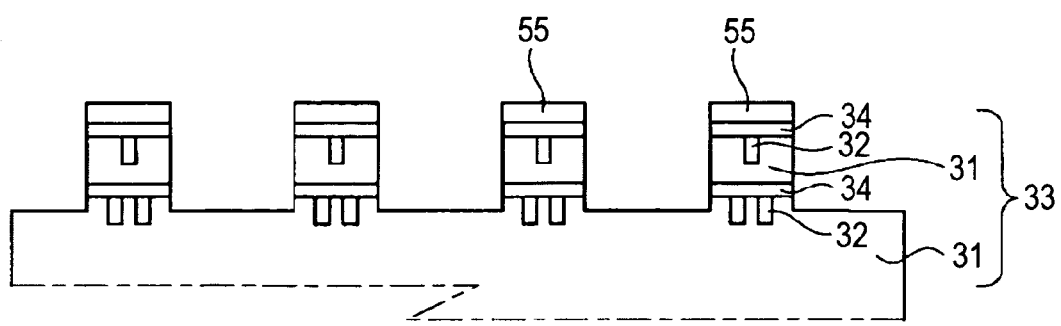

Next, as shown in FIG. 14B, the underlying barrier metal film 34 and interlayer insulating film 31 are selectively etched through the hard mask 55 to have a predetermined depth to form the concave portions 41.

Figure 15A:
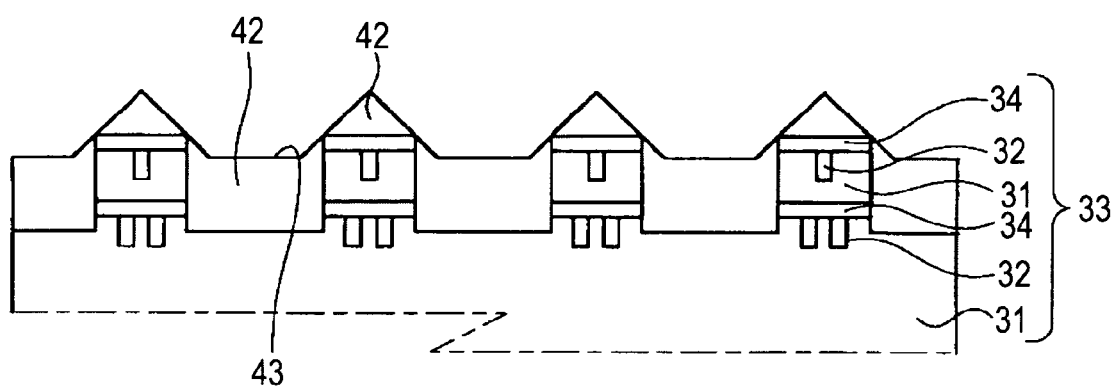
FIGS. 15A and 15B are a second set of manufacturing process views showing an example of a method of manufacturing a solid-state imaging device according to the eighth embodiment.

Next, as shown in FIG. 15A, the first insulating film 42, in this embodiment, a silicon oxide film, is buried in the concave portions 41 by the HDP deposition method. As described above, the first insulating film 42 is buried to have the concave portions 43 surrounded by the sidewalls at about 45 degrees.

At the time of HDP deposition, the first insulating film 42 having a lattice shape is formed on the barrier metal film 34 and the interlayer insulating film 31 with the same plane as the surface of the barrier metal film 34, such that the concave portions 43 are partially connected to the sidewalls of the concave portions 43 simultaneously. The first insulating film 42 has a triangular section shape with an inclined surface at about 45 degrees. The concave portions 43 are formed in a lattice shape in plan view.

Figure 15B:
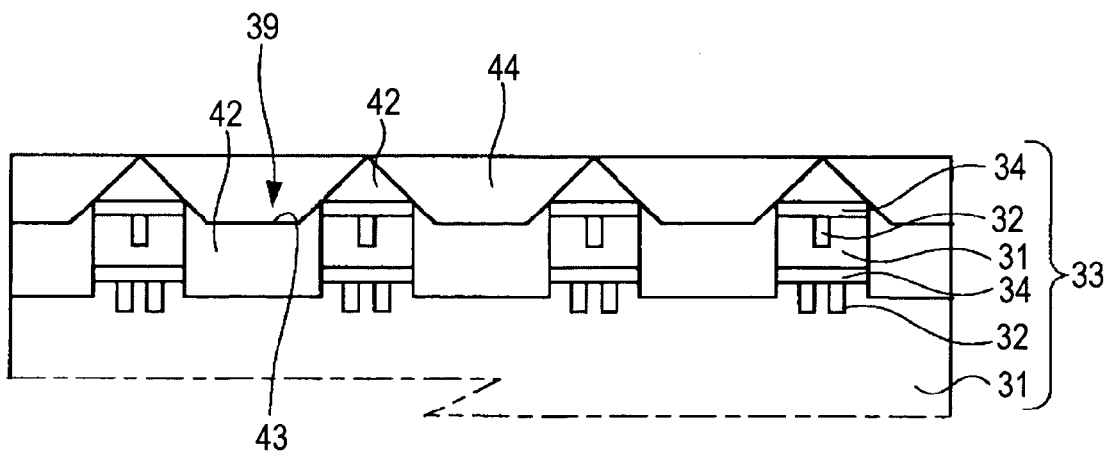

Next, as shown in FIG. 15B, the second insulating film 44 serving as a lens member, in this embodiment, a silicon nitride film, is buried in the concave portions 43. Thus, the first downward convex lenses 39 are formed. The second insulating film 44 buried in the concave portions 43 is uniformly planarized such that the surfaces of the first downward convex lenses 39 become the same plane. The first downward convex lenses 39 are formed by self-alignment with respect to the base layer having the concave portions 41.

Figure 16A:
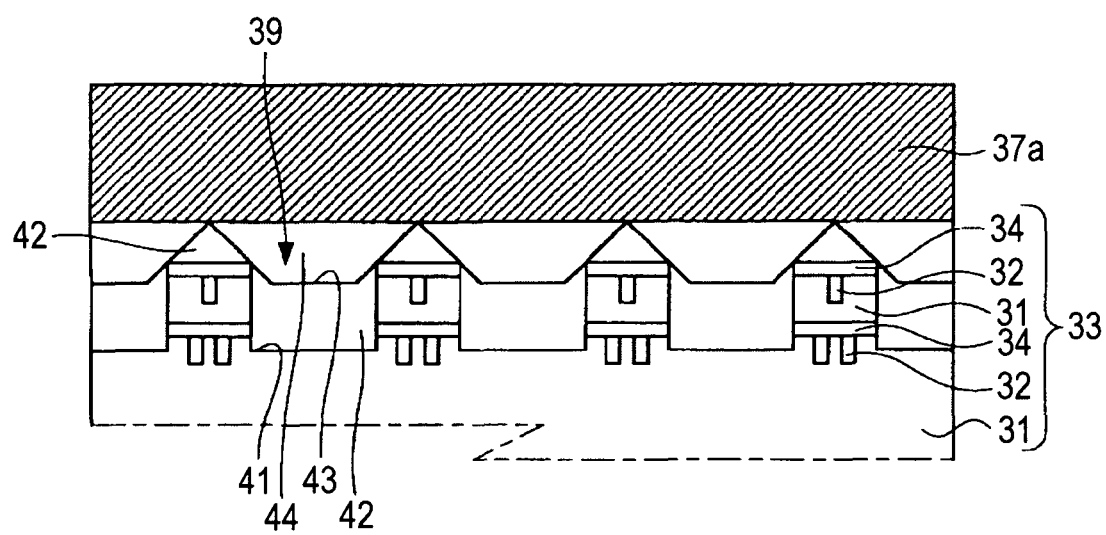
FIGS. 16A and 16B are a third set of manufacturing process views showing an example of a method of manufacturing a solid-state imaging device according to the eighth embodiment.

Next, as shown in FIG. 16A, a light-shielding member material film 37a having a predetermined thickness is formed on the entire surface of the first downward convex lenses 39. As described above, the light-shielding member material film 37a may be formed of, for example, a metal film, such as aluminum (Al) or tungsten (W).

Figure 16B:
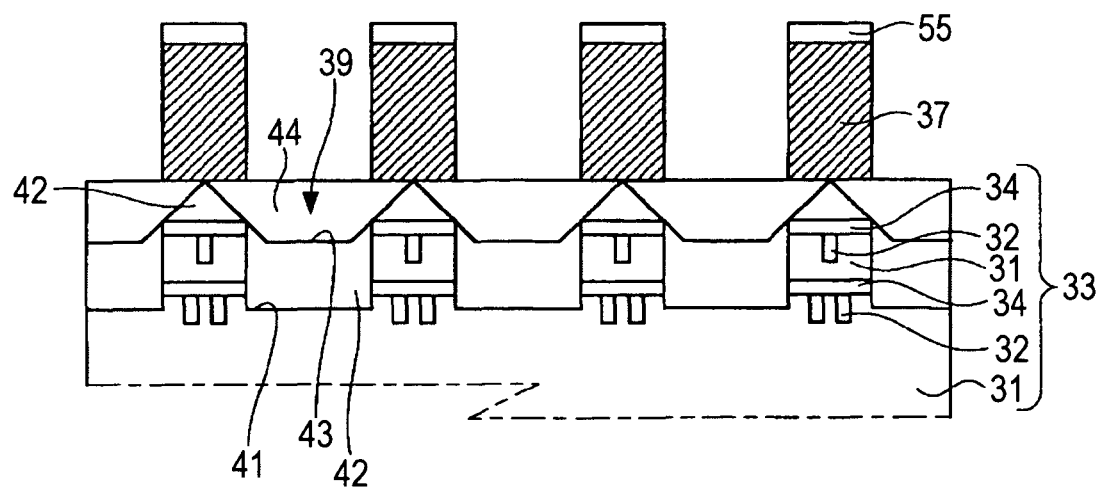

Next, as shown in FIG. 16B, the hard mask 55 having a pattern corresponding to the pattern of light-shielding members to be formed is formed on the light-shielding member material film 37a. The light-shielding member material film 37a is selectively etched and patterned to form the light-shielding members 37.

Figure 17A:
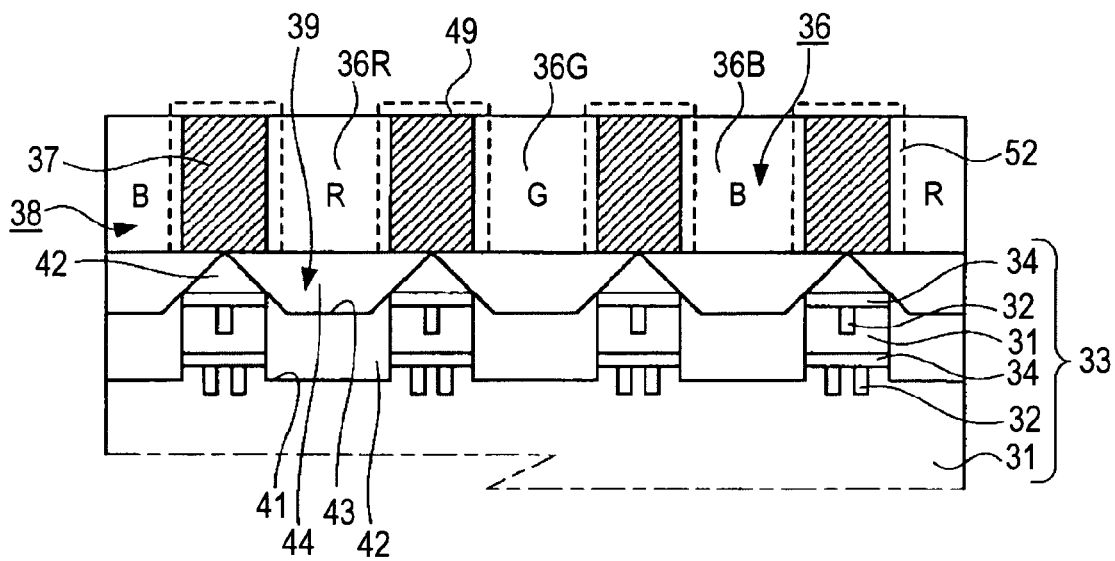
FIGS. 17A and 17B are a fourth set of manufacturing process views showing an example of a method of manufacturing a solid-state imaging device according to the eighth embodiment.
Figure 17B:
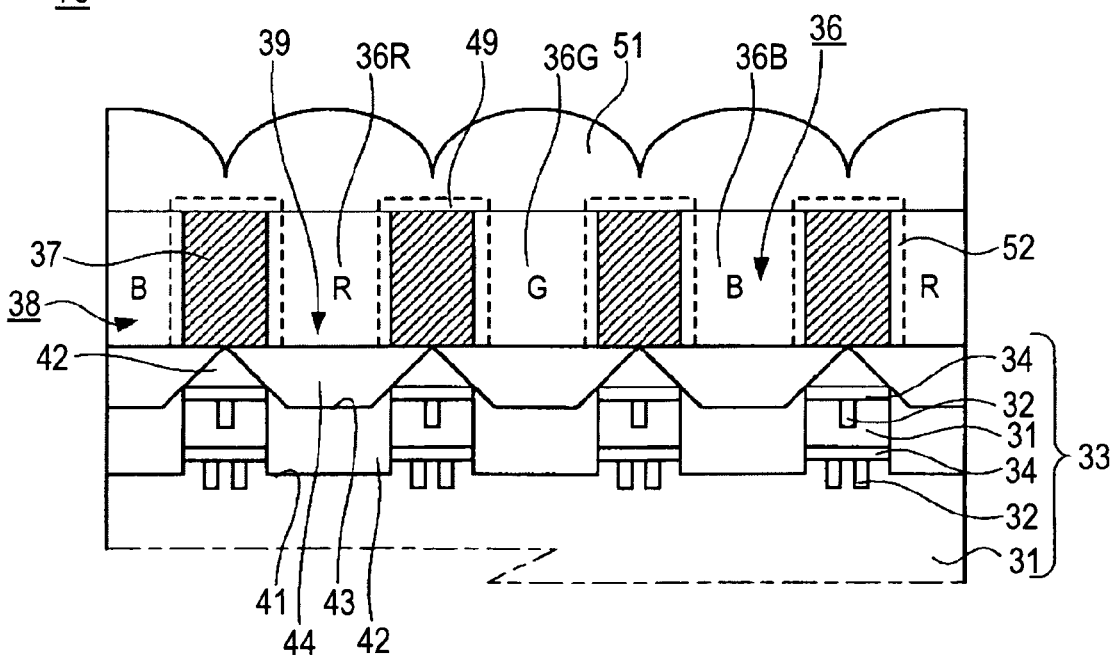

Next, as shown in FIG. 17A, the color filter components 36R, 36G, and 36B are formed so as to be filled in the portions surrounded by the light-shielding members 37, that is, the portions corresponding to the photodiodes PD (not shown). Thus, the on-chip color filter 38 is formed. When the light-shielding members 37 are formed of an aluminum (Al) film, the surfaces of the light-shielding members 37 are covered with a light-resistant film 52, as indicated by a chain line.

Next, the on-chip microlenses 51 are formed on the on-chip color filter 38. Thus, the intended solid-state imaging device 73 of the eighth embodiment is obtained.

With the method of manufacturing a solid-state imaging device of this embodiment, the solid-state imaging device 73 can be manufactured in which the color filter components 36 are surrounded by the light-shielding members 37, and the downward convex lenses 39 are respectively formed directly below the color filter components 36 by self-alignment. That is, the solid-state imaging device 73 with fine pixels capable of suppressing occurrence of color mixture and obtaining an image with good image quality can be manufactured.

Figure 18:
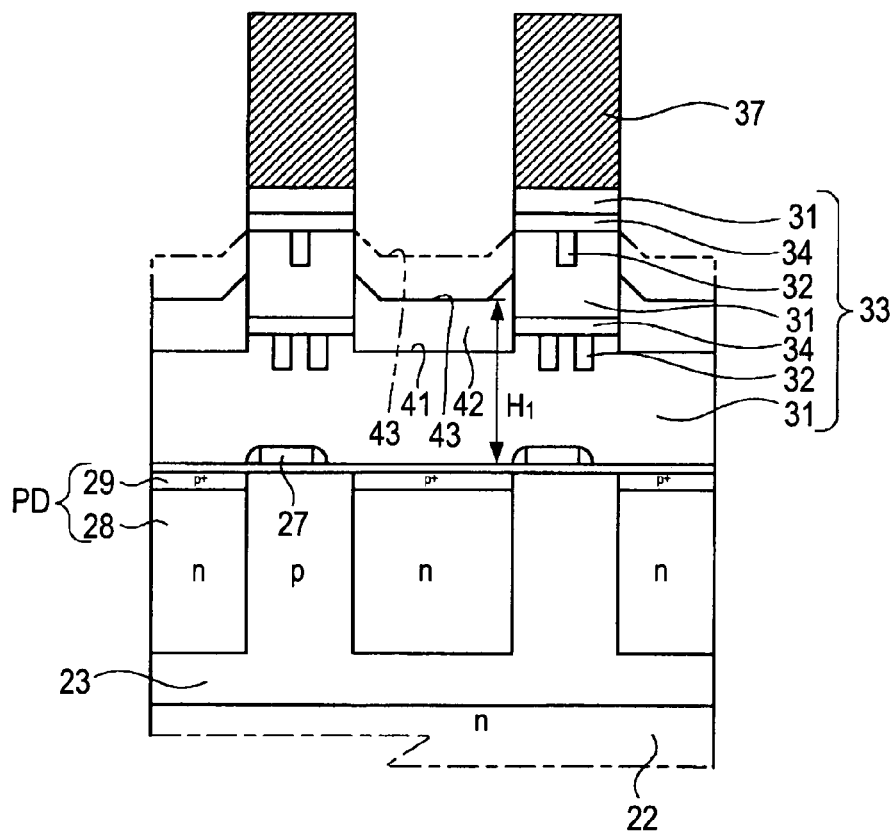
FIG. 18 is an explanatory view of a configuration which is applied to respective embodiments of the invention.

In the first to eighth embodiments, as shown in FIG. 18, the thickness of the first insulating film 42 buried in the concave portions 41 is controlled to the bottom positions of the concave portions 43 of the first insulating film 42. In this way, the distance H1 between the first downward convex lenses 39 and the photodiodes PD can be controlled.

<10. Ninth Embodiment>

[Example of Configuration of Surface Irradiation Type MOS Solid-State Imaging Device]

Figure 19:
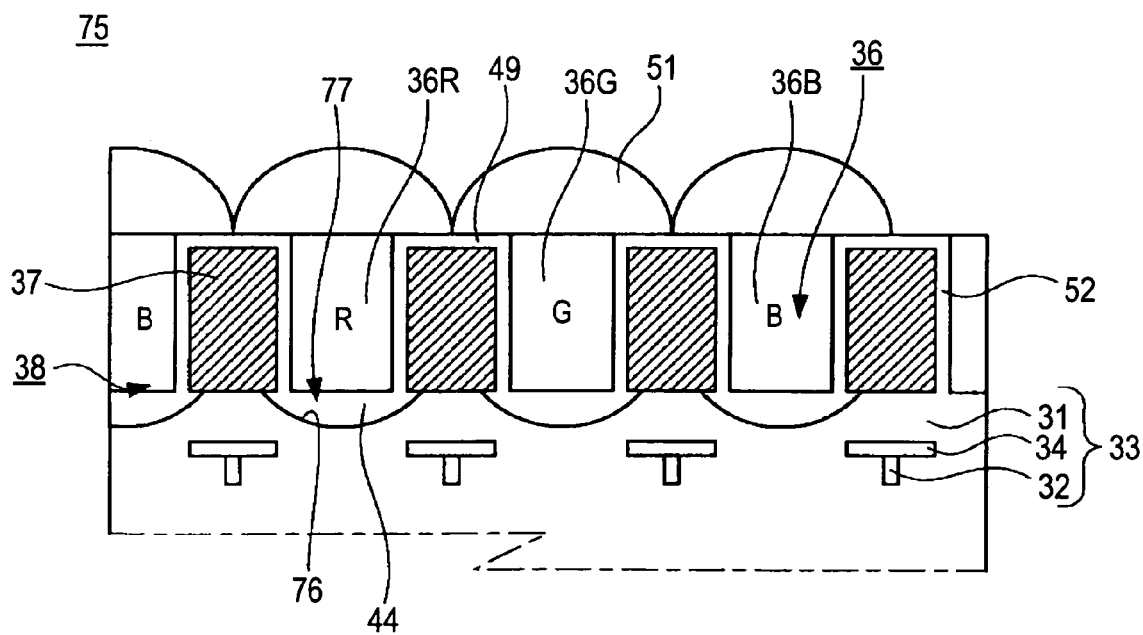
FIG. 19 is a diagram showing the schematic configuration of a main part of a solid-state imaging device according to a ninth embodiment of the invention.

FIG. 19 shows a solid-state imaging device according to a ninth embodiment of the invention. A solid-state imaging device of this embodiment is a surface irradiation type MOS solid-state imaging device. FIG. 19 shows a main part of a pixel section of the solid-state imaging device. A solid-state imaging device 75 of the ninth embodiment is configured such that downward convex lenses having a curved surface are formed directly below the color filter components 36 by isotropic etching with light-shielding members 37 as a mask and burying of a lens member in the etched concave portions. This solid-state imaging device 75 is applied to an example where the light-shielding members 37 have a comparatively large width w1.

That is, in this embodiment, after the light-shielding members 37 having a large width w1 are formed, a base layer, for example, an interlayer insulating film 31 made of a silicon oxide film, is selectively removed by isotropic etching with the light-shielding members 37 as a mask to form concave portions 76 having a curved bottom surface. A second insulating film 44 serving as a lens member, in this embodiment, a silicon nitride film, is buried in the concave portions 76. Thus, first downward convex lenses 77 having a curved surface are formed. Next, if necessary, after the surfaces of the light-shielding members 37 are covered with a light-resistant film 52, the color filter components 36R, 36G, and 36B are buried in the portions surrounded by the light-shielding members 37. Thus, an on-chip color filter 38 is formed. No second downward convex lenses are formed on the color filter components 36. Thereafter, on-chip microlenses 51 are formed on the on-chip color filter 38, thereby forming the solid-state imaging device 75.

Other parts are the same as those described in the first embodiment. Thus, the portions corresponding to FIG. 2 are represented by the same reference numerals, and overlap description will be omitted.

With the solid-state imaging device 75 of the ninth embodiment, the light-shielding members 37 are respectively formed at the boundary of the color filter components 36R, 36G, and 36B of the on-chip color filter 38. Thus, color mixture between the color filter components 36 can be suppressed. The first downward convex lenses 39 are respectively formed below the color filter components 36 by self-alignment with the light-shielding members 37 as a mask, so incident light can be focused and light can be prevented from leaking toward adjacent pixels. The first downward convex lenses 39 are formed by self-alignment with the light-shielding members 37 as a mask, so there is no misalignment between the color filter components 36 and the downward convex lenses 39. Therefore, the solid-state imaging device 75 of this embodiment can suppress color mixture and obtain an image with high image quality even though pixels are reduced in size.

<11. Tenth Embodiment>
[Example of Configuration of Back Irradiation Type MOS Solid-State Imaging Device]

Figure 20:
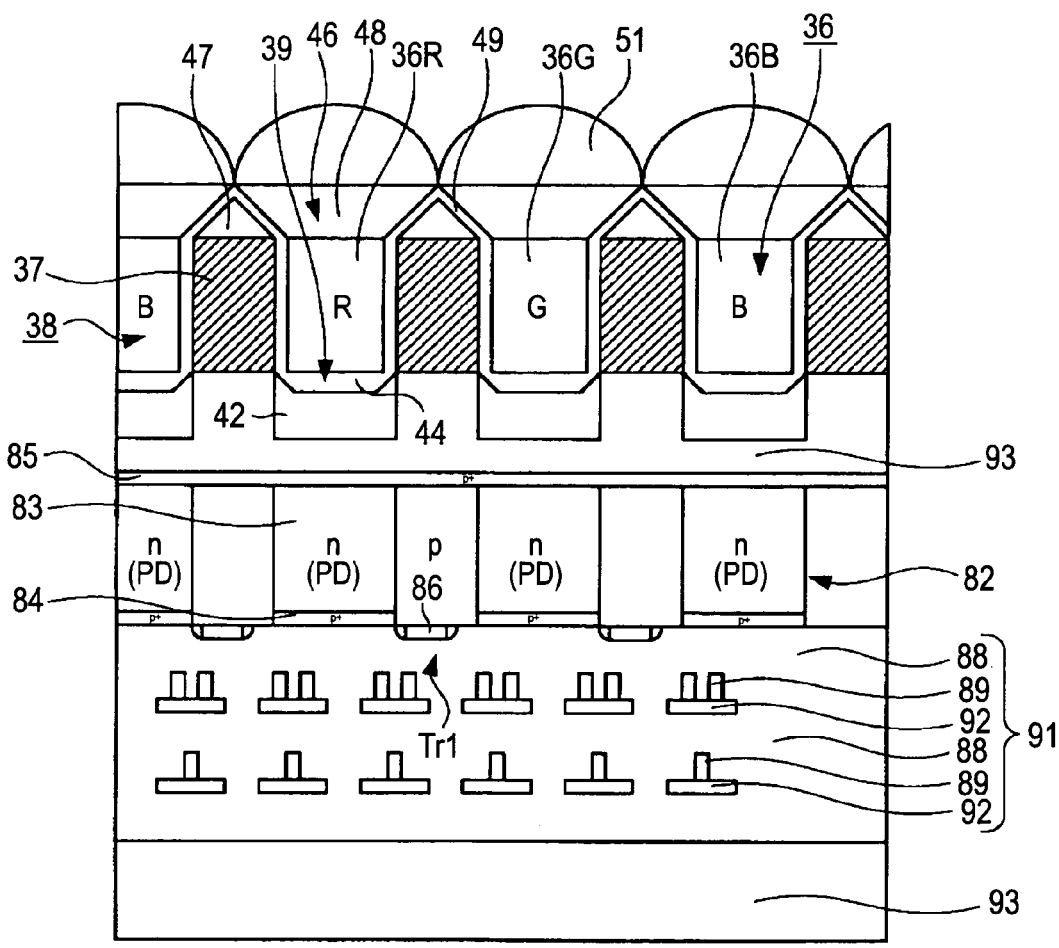
FIG. 20 is a diagram showing the schematic configuration of a main part of a solid-state imaging device according to a tenth embodiment of the invention.

FIG. 20 shows a solid-state imaging device according to a tenth embodiment of the invention. A solid-state imaging device of this embodiment is a back irradiation type MOS solid-state imaging device. FIG. 20 shows a main part of a pixel section of the solid-state imaging device. A solid-state imaging device 81 of the tenth embodiment is structured such that a plurality of unit pixels are formed in a two-dimensional array in the area of a second conduction type (for example, p-type) semiconductor substrate 82 corresponding to a pixel section 24. Each of the unit pixels includes a photodiode PD and a plurality of pixel transistors. The photodiode PD has an n-type semiconductor area 83 over the substantially entire area of the semiconductor substrate 82 in the thickness direction and p-type semiconductor areas 84 and 85 formed on the front and back surfaces of the n-type semiconductor area 83. The p-type semiconductor areas 84 and 85 also serve as a hole accumulation area for suppressing dark current. In the drawing, a plurality of pixel transistors are represented by a transfer transistor Tr1 having a transfer gate electrode 86.

Multiple layers (in this embodiment, two layers) of wiring 89 are formed on the surface of the semiconductor substrate 82 through interlayer insulating films 88 to form a multilayer wiring layer 91. The interlayer insulating films 88 are formed of, for example, a silicon oxide film. The wiring 89 is formed of, for example, copper (Cu) wiring. A barrier metal film (not shown) for preventing diffusion of the Cu wiring is formed on the lower surface and the side surface of the wiring 89, and a barrier metal film 92 is formed on the upper surface of the wiring 89. The barrier metal film 92 is formed of SiC, SiN, TiN, or the like. In this embodiment, the barrier metal film 92 is formed of a SiC film. The wiring 89 and the barrier metal film 92 may be formed regardless of the photodiodes PD. A support substrate 93 formed of, for example, a silicon substrate or the like is bonded onto the multilayer wiring layer 91.

An on-chip color filter 38 having color filter components 36 [36R, 36G, and 36B] formed to correspond to pixels is formed on the rear surface of the semiconductor substrate 82 as a light-receiving side. On-chip microlenses 51 are formed on the on-chip color filter 38.

In this embodiment, light-shielding members 37 are respectively formed at the boundary of adjacent color filter components 36, and first downward convex lenses 39 are respectively formed directly below the color filter components facing the photodiodes PD by self-alignment with the light-shielding members 37 as a mask. Similarly, second downward convex lenses 46 are formed directly above the color filter components 36 facing the on-chip microlenses 51 by self-alignment.

That is, in this embodiment, as described above, the light-shielding members 37 are formed on the rear surface of the semiconductor substrate 82 through an insulating film 93 made of, for example, a silicon oxide film, and the insulating film 93 is selectively etched to a given depth with a light-shielding film 37 as a mask to form concave portions 41. Next, a first insulating film 42 having concave portions 43 surrounded by sidewalls at about 45 degrees are buried in the concave portions 41 by an HDP deposition method, and a second insulating film having a planarized surface is buried in the concave portions 43. Thus, the first downward convex lenses 39 are formed. At the time of HDP deposition, a frame-shaped first insulating film 47 is formed on the top surfaces of the light-shielding members 37 to have having a triangular sectional shape having an inclines surface at about 45 degrees. Next, if necessary, a light-resistant film 52 is formed to cover the light-shielding members 37, and the color filter components. 36R, 36G, and 36B are formed to be filled in the portions surrounded by the light-shielding members 37. Next, a second insulating film 48 is buried in the concave portions surrounded by the frame-shaped first insulating film 47 having a triangular sectional shape on the color filter components 36. Thus, second downward convex lenses 46 are formed. The first insulating films 42 and 47 are formed of, for example, a silicon oxide film, and the second insulating films 44 and 48 serving as a lens member are formed of, for example, a silicon nitride film.

With the back irradiation type solid-state imaging device 81 of the tenth embodiment, the light-shielding members 37 are respectively formed at the boundary of the color filter components 36R, 36G, and 36B of the on-chip color filter 38. Thus, color mixture between the color filter components 36 can be suppressed. The first downward convex lenses 39 and the second downward convex lenses 46 are formed above and below the color filter components 36 by self-alignment, so incident light can be focused and light can be prevented from leaking toward adjacent pixels. The first and second downward convex lenses 39 and 46 are formed by self-alignment with the light-shielding members 37 as a mask, so there is no misalignment between the color filter components 36 and the downward convex lenses 39. Therefore, the solid-state imaging device 81 of this embodiment can suppress color mixture and obtain an image with high image quality even though pixels are reduced in size.

Although in the tenth embodiment, the configuration of the upper portion including the first downward convex lenses 39 and the on-chip color filter 38 is the same as the first embodiment, and the configuration of each of the above-described embodiments may be used.

<12. Eleventh Embodiment>
[Example of Configuration of CCD Solid-State Imaging Device]

A solid-state imaging device according to an eleventh embodiment of the invention will be described. This embodiment is an application to a CCD solid-state imaging device. A CCD solid-state imaging device of the eleventh embodiment is structured such that, though not shown, a second conduction type (for example, p-type) a first semiconductor well area is formed in a first conduction type (for example, n-type) semiconductor substrate (silicon substrate). Photodiodes (PD) forming light-receiving parts (photoelectric converters) are formed in a two-dimensional array in the p-type first semiconductor well area. Each of the photodiodes has an n-type semiconductor area serving as a charge accumulation area, and a p-type semiconductor area also serving as a hole accumulation area for suppressing dark current on the surface. A buried n-type transfer channel area and a p-type channel stop area are further formed in the p-type first semiconductor well area, and a p-type second semiconductor well area is formed directly below the n-type transfer channel area.

A transfer electrode formed of a plurality of polysilicon films is formed on the n-type transfer channel area through a gate insulating film along a vertical direction. A light-shielding film is formed to cover the transfer electrode excluding the photodiodes (PD), and a planarized film made of an insulating film is further formed on the upper surface of the light-shielding film.

In this embodiment, the planarized film is formed of, for example, a silicon oxide film. As described in the above-described first embodiment, light-shielding members 37 are formed on the planarized film corresponding to the base layer in a lattice shape in plan view to correspond to color filter components to be formed. First downward convex lenses 39 are formed in the planarized film corresponding to the photodiodes (PD) by self-alignment with the light-shielding members 37 as a mask. Next, the color filter components 36 [36R, 36G, and 36B] are formed in the portions surrounded by the light-shielding members 37 to form an on-chip color filter 38. Further, second downward convex lenses 46 are respectively formed on the color filter components 36, and on-chip microlenses 51 are respectively formed on the second downward convex lenses 46. Thus, the CCD solid-state imaging device of the eleventh embodiment is obtained.

In the CCD solid-state imaging device of the eleventh embodiment, as described in the first embodiment, the light-shielding members 37 are respectively formed at the boundary of the color filter components 36 of the on-chip color filter 38. Thus, color mixture between the color filter components 36 can be suppressed. Further, the first downward convex lenses 39 and the second downward convex lenses 46 are provided above and below the color filter components 36 by self-alignment, so incident light can be focused and light can be prevented from leaking toward adjacent pixels. Therefore, the solid-state imaging device. 81 of this embodiment can suppress color mixture and obtain an image with high image quality even though pixels are reduced in size.

Although in the eleventh embodiment, the configuration of the upper portion including the first downward convex lenses 39 and the on-chip color filter 38 is the same as the first embodiment, the configuration of each of the above-described embodiments may be used. The configuration of the upper portion including the first downward convex lenses 39 and the on-chip color filter 38 of the CCD solid-state imaging device may be formed by the manufacturing method of FIGS. 3A to 6B or the manufacturing method of FIGS. 14A to 17B with the planarized film as a base layer.

Although in the solid-state imaging device in each of the foregoing embodiments, signal charges are electrons, the first conduction type is an n-type, and the second conduction type is a p-type, the invention may be applied to a solid-state imaging device in which signal charges are holes. In this case, the conduction types of the semiconductor substrates or the semiconductor areas may be reversed such that the p-type may be the first conduction type, and the n-type may be the second conduction type.

<13. Twelfth Embodiment>
[Example of Configuration of Electronic Apparatus]

The solid-state imaging device according to the respective embodiments of the invention can be applied to an electronic apparatus, such as a camera with a solid-state imaging device, a mobile apparatus with a camera, or various apparatuses with a solid-state imaging device. In particular, the solid-state imaging device can be applied to a camera with a compact solid-state imaging device having fine pixels.

Figure 21:
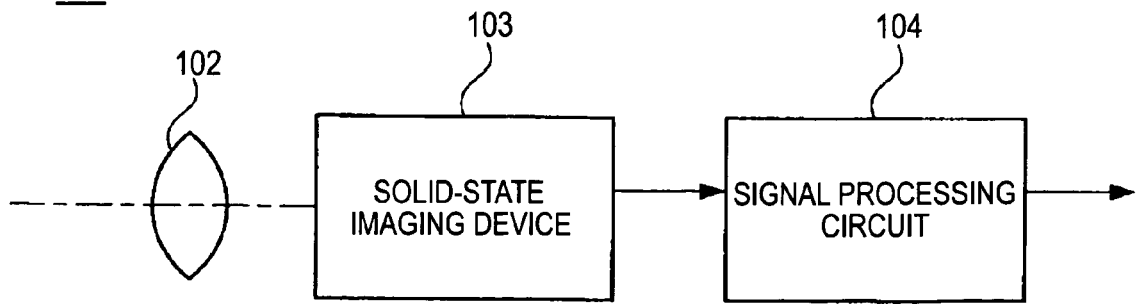
FIG. 21 is a diagram showing the schematic configuration of an electronic apparatus according to a twelfth embodiment of the invention.
Figure 22:
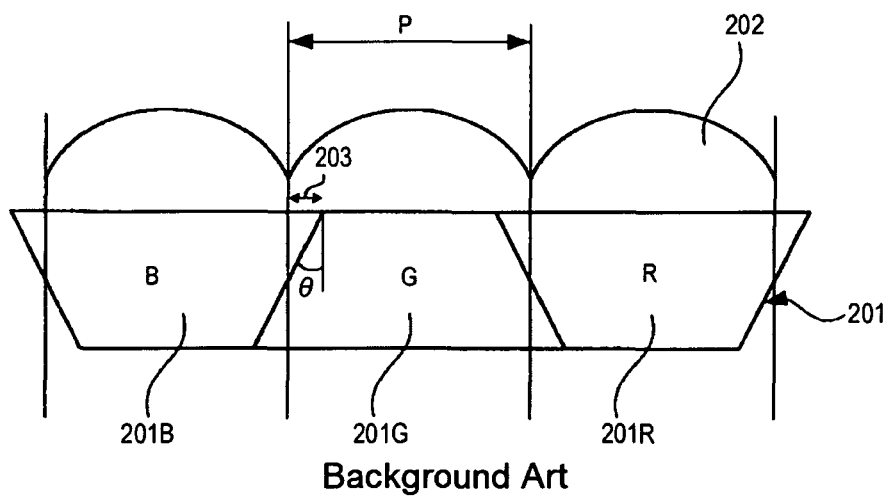
FIG. 22 is a sectional view of a main part of an on-chip color filter in a solid-state imaging device according to the related art.
Figure 23:
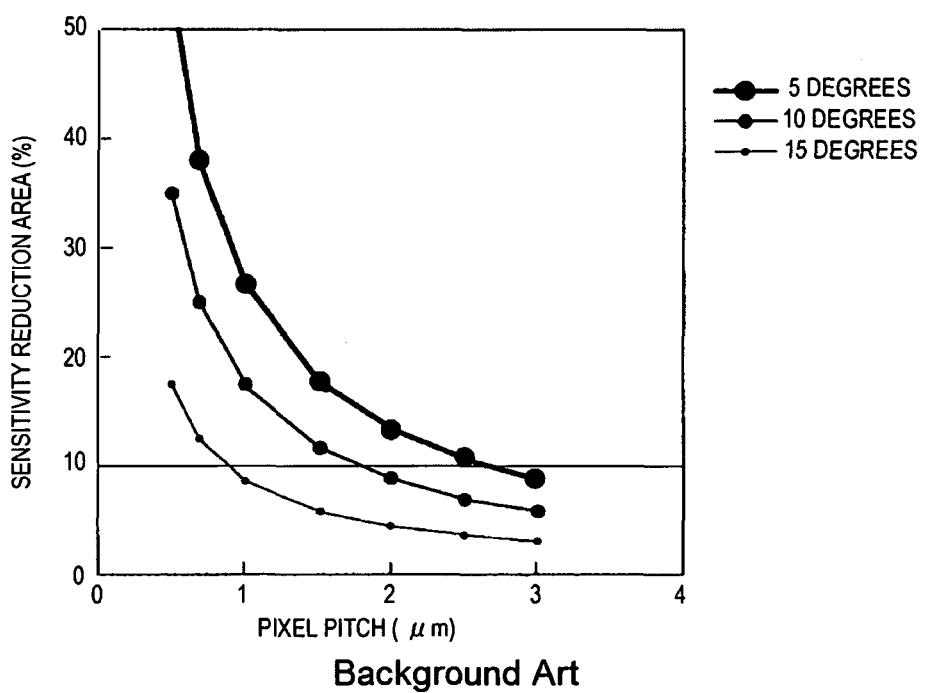
FIG. 23 is a graph showing the relationship between a sensitivity reduction area (%) and a pixel pitch (μm) with the taper angle of a color filter component in the solid-state imaging device according to the related art as a parameter.

FIG. 21 shows an embodiment which is applied to a camera as an example of an electronic apparatus of the invention. A camera 101 of this embodiment includes a solid-state imaging device 103, an optical system (optical lens) 102 guiding incident light to the photoelectric converters of the solid-state imaging device 103, and a signal processing circuit 104 processing an output signal of the solid-state imaging device. As the solid-state imaging, device 103, the solid-state imaging device of any one of the foregoing embodiments is used. The optical system 102 focuses image light (incident light) from a subject on the imaging surface of the solid-state imaging device 103. Accordingly, signal charges are accumulated in the photodiodes as the photoelectric converters of the solid-state imaging device 103 for a predetermined time. The signal processing circuit 104 performs various kinds of signal processing on the output signal of the solid-state imaging device 103 and outputs the processed signal. The camera 101 of this embodiment has a camera module in which the optical system 102, the solid-state imaging device 103, and the signal processing circuit 104 are modularized.

The configuration of FIG. 21 may be formed as a module having a so-called imaging function in which the optical system 102, the solid-state imaging device 103, and the signal processing circuit 104 are modularized. That is, the configuration of the camera may be constituted as a so-called imaging function module. According to the embodiment of the invention, an electronic apparatus including such an imaging function module can be formed.

With the electronic apparatus of this embodiment, in the solid-state imaging device, color mixture is suppressed. Therefore, a high-quality electronic apparatus capable of obtaining an image with high image quality can be provided even though pixels are reduced in size and the apparatus is reduced in size.

The present application contains subject matter related to that disclosed in Japanese Priority Patent Application JP 2009-088096 filed in the Japan Patent Office on Mar. 31, 2009, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
an on-chip color filter having color filter components corresponding to pixels;
light-shielding members each positioned at the boundary of adjacent color filter components;
a first set of lenses concave toward a light incident side of the solid-state imaging device, each positioned to directly correspond to one of the pixels and one of the color filter components by self-alignment with the light-shielding members; and
a frame-shaped first insulating film formed on an object side of the light-shielding members and configured to have a triangular sectional shape, and gapless on-chip microlenses are formed on the on-chip color filter so as to terminate at the apex of the triangular sectional shape.

2. The solid-state imaging device according to claim 1, further comprising:
a second set of lenses concave toward the light incident side of the solid-state imaging device, each positioned to directly correspond to one of the color filter components by self-alignment.

3. The solid-state imaging device according to claim 1, wherein the first set of lenses are formed by a first insulating film having concave portions surrounded by sidewalls inclined at a predetermined angle, and a second insulating film buried in the concave portions.

4. The solid-state imaging device according to claim 2, wherein the second set of lenses are formed by the frame-shaped first insulating film formed on the object side of the light-shielding members and surrounded by sidewalls inclined at a predetermined angle, and a second insulating film buried in the frame-shaped first insulating film.

5. The solid-state imaging device according to claim 1, wherein the light-shielding members are covered with a light-resistance film.

6. A solid-state imaging device comprising:
an on-chip color filter having color filter components corresponding to pixels;
light-shielding members each positioned at the boundary of adjacent color filter components;
a first set of lenses concave toward a light incident side of the solid-state imaging device, each positioned to directly correspond to one of the pixels and one of the color filter components by self-alignment with respect to a base layer; and
a frame-shaped first insulating film formed on an object side of the light-shielding members and configured to have a triangular sectional shape, and gapless on-chip microlenses are formed on the on-chip color filter so as to terminate at the apex of the triangular sectional shape.

7. The solid-state imaging device according to claim 6, a second set of lenses concave toward a light incident side of the solid-state imaging device, each positioned to directly correspond to one of the color filter components, first lens, and pixels by self-alignment.

8. The solid-state imaging device according to claim 6, wherein the first set of lenses are formed by a first insulating film having concave portions surrounded by sidewalls inclined at a predetermined angle, and a second insulating film buried in the concave portions.

9. The solid-state imaging device according to claim 7, wherein the second set of lenses are formed by the frame-shaped first insulating film formed on the object side of the light-shielding members and surrounded by sidewalls inclined at a predetermined angle, and a second insulating film buried in the frame-shaped first insulating film.

10. The solid-state imaging device according to claim 6, wherein the light-shielding members are covered with a light-resistance film.

11. An electronic apparatus comprising:
a solid-state imaging device;
an optical system guiding incident light to photoelectric converters of the solid-state imaging device; and
a signal processing circuit processing an output signal of the solid-state imaging device, wherein the solid-state imaging device has an on-chip color filter having color filter components corresponding to pixels, light-shielding members each positioned at the boundary of adjacent color filter components,
a first set of lenses concave toward a light incident side of the solid-state imaging device, each positioned to directly correspond to one of the pixels and one of the color filter components by self-alignment, and
a frame-shaped first insulating film formed on an object side of the light-shielding members and configured to have a triangular sectional shape, and gapless on-chip microlenses are formed on the on-chip color filter so as to terminate at the apex of the triangular sectional shape.

12. The electronic apparatus according to claim 11, wherein, in the solid-state imaging device, a second set of lenses concave toward the light incident side of the solid-state imaging device, each positioned to directly correspond to one of the color filter components, first lens, and pixels by self-alignment.

13. The electronic apparatus according to claim 11, wherein the first set of lenses are formed by a first insulating film having concave portions surrounded by sidewalls inclined at a predetermined angle, and a second insulating film buried in the concave portions.

14. The electronic apparatus according to claim 13, wherein the second set of lenses are formed by the frame-shaped first insulating film formed on the object side of the light-shielding members and surrounded by sidewalls inclined at a predetermined angle, and a second insulating film buried in the frame-shaped first insulating film.

15. The electronic apparatus according to claim 11, wherein the light-shielding members are covered with a light-resistance film.

* * * * *